(12) United States Patent
Luo et al.

(10) Patent No.: US 9,009,568 B2
(45) Date of Patent: Apr. 14, 2015

(54) SENSING PARAMETER MANAGEMENT IN NON-VOLATILE MEMORY STORAGE SYSTEM TO COMPENSATE FOR BROKEN WORD LINES

(71) Applicant: Sandisk Technologies Inc., Plano, TX (US)

(72) Inventors: Ting Luo, Sunnyvale, CA (US); Nian Niles Yang, Mountain View, CA (US); Chris Avila, Saratoga, CA (US); Uday Chandrasekhar, San Jose, CA (US); Jianmin Huang, San Carlos, CA (US)

(73) Assignee: Sandisk Technologies Inc., Plano, TX (US)

( * ) Notice: Subject to any disclaimer, the term of this patent is extended or adjusted under 35 U.S.C. 154(b) by 83 days.

(21) Appl. No.: 13/963,294

(22) Filed: Aug. 9, 2013

(65) Prior Publication Data

US 2015/0046770 A1 Feb. 12, 2015

(51) Int. Cl.
*G11C 29/00* (2006.01)
*G11C 29/12* (2006.01)
*G06F 11/14* (2006.01)

(52) U.S. Cl.
CPC ...... *G11C 29/12005* (2013.01); *G06F 11/1412* (2013.01)

(58) Field of Classification Search
CPC ........... G11C 11/5628; G11C 16/0483; G11C 16/24; G11C 16/3436; G11C 2211/5621; G11C 16/3427; G11C 11/5642; G11C 2211/5644; G11C 16/3454; G11C 16/26; G11C 16/08; G11C 16/3459; G11C 16/3418; G11C 29/52; G11C 29/025
See application file for complete search history.

(56) References Cited

U.S. PATENT DOCUMENTS

| | | | |
|---|---|---|---|
| 5,930,167 | A | 7/1999 | Lee |
| 5,936,884 | A | 8/1999 | Hasbun |
| 6,407,953 | B1 * | 6/2002 | Cleeves ........................ 365/201 |
| 6,717,847 | B2 | 4/2004 | Chen |
| 7,196,928 | B2 | 3/2007 | Chen |
| 7,251,717 | B2 | 7/2007 | Nishikawa |
| 7,310,347 | B2 | 12/2007 | Lasser |

(Continued)

FOREIGN PATENT DOCUMENTS

EP 2200045 6/2010

OTHER PUBLICATIONS

U.S. Appl. No. 13/668,160, filed Nov. 2, 2012, (Continued)

*Primary Examiner* — Guerrier Merant
(74) *Attorney, Agent, or Firm* — Vierra Magen Marcus LLP

(57) ABSTRACT

Disclosed is a technology to change the parameters by which a read operation is performed in a block with a broken word line. The first method is for reading a broken word line, which may involve changing the voltage on word lines neighboring the broken word line to let the voltage on the broken word line reach the appropriate magnitude through capacitive coupling between word lines. The first method may also involve increasing the time delay before memory cells connected to the broken word line are sensed to allow the voltage on the word line to settle due to increased RC delay. The second method is for reading an unbroken word line in a block with a broken word line, which involves increasing the time delay before memory cells connected to the unbroken word line are sensed while raising the voltages on the word lines neighboring the broken word line.

20 Claims, 20 Drawing Sheets

(56) References Cited

U.S. PATENT DOCUMENTS

| | | | |
|---|---|---|---|
| 7,388,781 B2 | 6/2008 | Litsyn | |
| 7,440,319 B2 | 10/2008 | Li | |
| 7,570,520 B2 | 8/2009 | Kamei | |
| 7,885,119 B2 | 2/2011 | Li | |
| 7,995,388 B1 | 8/2011 | Winter | |
| 8,111,548 B2 | 2/2012 | Mokhlesi | |
| 2006/0285391 A1 | 12/2006 | Cernea | |
| 2006/0291303 A1 | 12/2006 | Kleveland | |
| 2007/0121378 A1 | 5/2007 | Shibata | |
| 2007/0180346 A1 | 8/2007 | Murin | |
| 2008/0074928 A1 | 3/2008 | Choi | |
| 2008/0084754 A1 | 4/2008 | Mokhlesi | |
| 2008/0123412 A1 | 5/2008 | Lasser | |
| 2008/0259684 A1 | 10/2008 | Shlick | |
| 2008/0266948 A1 | 10/2008 | Jang | |
| 2009/0089481 A1 | 4/2009 | Kapoor | |
| 2011/0145668 A1 | 6/2011 | Kim | |
| 2012/0005558 A1 | 1/2012 | Steiner | |
| 2012/0008410 A1* | 1/2012 | Huynh et al. | 365/185.21 |
| 2012/0236670 A1 | 9/2012 | Hemink | |
| 2012/0281479 A1* | 11/2012 | Kochar et al. | 365/185.19 |
| 2012/0314502 A1 | 12/2012 | Mokhlesi | |

OTHER PUBLICATIONS

U.S. Appl. No. 13/749,956, filed Jan. 25, 2013.
U.S. Appl. No. 13/749,968, filed Jan. 25, 2013.
U.S. Appl. No. 13/831,420, filed Mar. 14, 2013.

* cited by examiner programmed population under study population of adjacent memory cells

SENSING PARAMETER MANAGEMENT IN NON-VOLATILE MEMORY STORAGE SYSTEM TO COMPENSATE FOR BROKEN WORD LINES

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM), including flash EEPROM, and Electrically Programmable Read Only Memory (EPROM) are among the most popular non-volatile semiconductor memories.

EEPROM and EPROM are non-volatile memories that can be erased and have new data written or "programmed" into their memory cells. Both utilize a floating gate in a transistor structure that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. For a given level charge on the floating gate, there is a corresponding threshold voltage that must be applied to the control gate before the transistor is turned "on" to permit conduction between its source and drain regions.

The floating gate can hold a range of charges and therefore, can be programmed to any threshold voltage level within a threshold voltage window. The size of the threshold voltage window is delimited by the minimum and maximum threshold levels of the device, which in turn correspond to the range of the charges that can be programmed onto the floating gate. The threshold voltage window generally depends on the memory device's characteristics, operating conditions, and history. Each distinct, resolvable threshold voltage level range within the window can, in principle, be used to designate a definite memory state of the cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

When programming an EEPROM, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. patent application Ser. No. 10/379,608, titled "Self-Boosting Technique," filed on Mar. 5, 2003 and U.S. patent application Ser. No. 10/629,068, titled "Detecting Over Programmed Memory," filed on Jul. 29, 2003, both of which are incorporated herein by reference in their entirety.

As memory cells and circuitry on semiconductor memory chips are scaled down in physical dimension to increase speed and memory density, physical defects that threaten data integrity and chip performance become more prevalent. Among these defects are breaks in word lines, the wires that connect control gates across rows of memory cells in blocks of memory. For example, the breaks in word lines can occur due to heat-induced warping of thin films in the memory die when the memory system is mounted to the circuit board. A break in a word line leads to increased electrical resistance in the word line, which may further lead to an inability to sufficiently charge up the control gate of a memory cell within the time normally allotted for read operations. A failure to sufficiently charge the control gate during read operations might result in errors.

DETAILED DESCRIPTION

Described below are a system and methods for performing adjusted read operations in a block of non-volatile memory in which a broken word line has been detected. Due to the increased RC delay caused by the break in the word line, voltages on the word lines in the block, as well as the timing of sensing operations, must be adjusted, sometimes in multiple iterations, in order for the voltage on the broken word line to reach the appropriate value for the read operation being performed. When the broken word line is being read, the broken word line must be raised to the proper read voltage, and when another word line is being read, the broken word line must be raised to a voltage such that the memory cells connected to the broken word line can properly act as pass gates.

One example of a memory system suitable for implementing embodiments of the disclosed technology uses the NAND flash memory structure, which includes arranging multiple transistors in series between two select gates. The transistors in series and the select gates are referred to as a NAND string. However, embodiments of the disclosed technology can also be implemented on memory technologies including but not limited to NOR, ORNAND, 3D memory, charge-trapping memory with materials such as silicon nitride, phase change memory such as ReRAM, semi-volatile memories such as DRAM and SRAM, and other memories that access units of stored data using word lines and bit lines.

Figure 1:
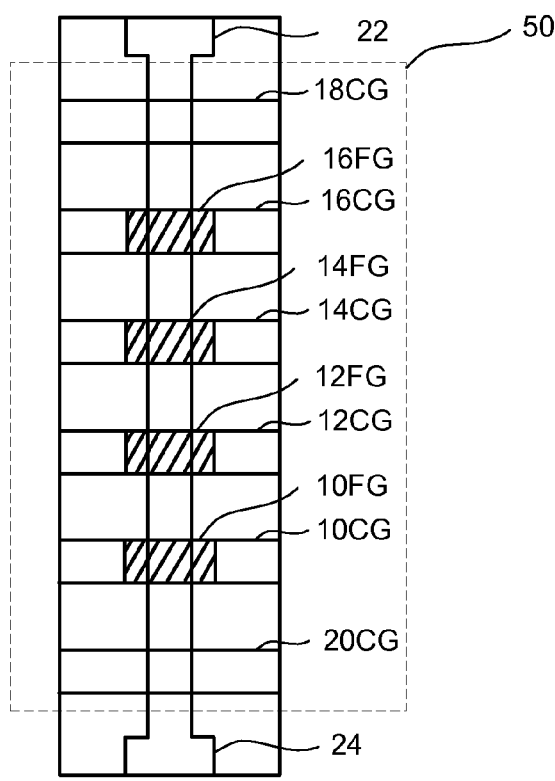
FIG. 1 is a top view of a NAND string.
Figure 2:
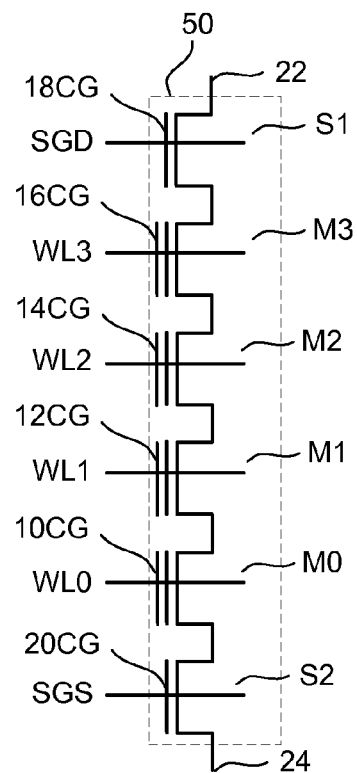
FIG. 2 is an equivalent circuit diagram of the NAND string.

FIG. 1 is a top view showing an exemplary NAND string 50. FIG. 2 is an equivalent circuit thereof. The NAND string depicted in FIGS. 1 and 2 includes transistors, M0, M1, M2, and M3, in series and sandwiched between a first select gate S1 and a second select gate S2. In one embodiment, transistors M0, M1, M2, and M3 each form an individual memory cell of the NAND string. In other embodiments, the memory cells of a NAND string may include multiple transistors or may be different than that depicted in FIGS. 1 and 2. The NAND string can include any number of memory cells, be it less than or greater than four as depicted (e.g., 2, 8, 16, 32, etc.). The discussion herein is not limited to any particular number of memory cells in a NAND string. Select gate S1 connects the NAND string to drain terminal 22 which is in turn connected to a bit line (not shown). Select gate S2 connects the NAND string to source terminal 24 which is in turn connected to a source line (not shown). Select gate S1 is controlled by applying the appropriate voltages to control gate 18CG via select line SGD and select gate S2 is controlled by applying the appropriate voltages to control gate 20CG via select line SGS. Each of the transistors M0, M1, M2, and M3 has a control gate and a floating gate. Transistor M0 includes control gate 10CG and floating gate 10FG. Transistor M1 includes control gate 12CG and floating gate 12FG. Transistor M2 includes control gate 14CG and floating gate 14FG. Transistor M3 includes control gate 16CG and floating gate 16FG. Control gate 10CG is connected to word line WL0, control gate 12CG is connected to word line WL1, control gate 14CG is connected to word line WL2, and control gate 16CG is connected to word line WL3.

Figure 3:
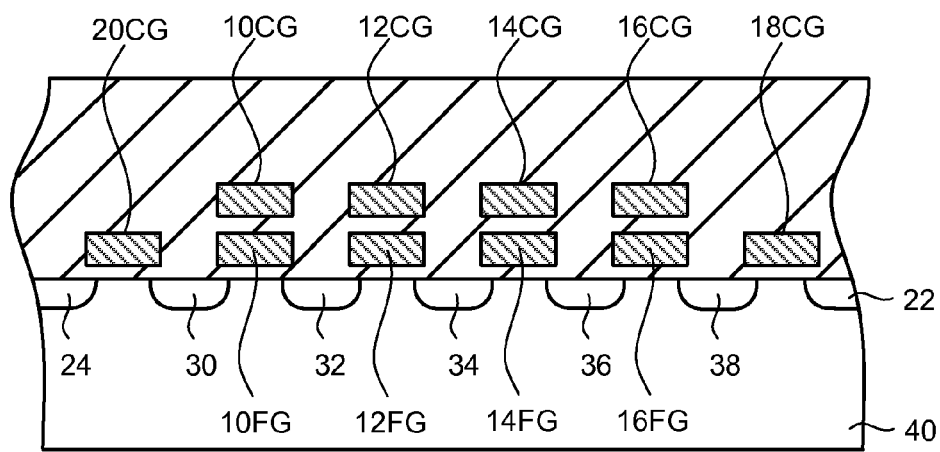
FIG. 3 is a cross-sectional view of the NAND string.

FIG. 3 provides a cross-sectional view of the NAND string described above, wherein it is assumed that there are four memory cells in the NAND string. Again, the discussion herein is not limited to any particular number of memory cells in a NAND string. As depicted in FIG. 3, the transistors of the NAND string are formed in p-well region 40. Each transistor includes a stacked gate structure that consists of a control gate (10CG, 12CG, 14CG and 16CG) and a floating gate (10FG, 12FG, 14FG and 16FG). The floating gates are formed on the surface of the p-well on top of an oxide or other dielectric film. The control gate is above the floating gate, with an inter-polysilicon dielectric layer separating the control gate and floating gate. The control gates of the memory cells (M0, M1, M2 and M3) form the word lines. N+ doped layers 30, 32, 34, 36 and 38 are shared between neighboring cells, whereby the cells are connected to one another in series to form a NAND string. These N+ doped layers form the source and drain of each of the elements of the string. For example, N+ doped layer 30 serves as the drain of transistor S2 and the source for transistor M0, N+ doped layer 32 serves as the drain for transistor M0 and the source for transistor M1, N+ doped layer 34 serves as the drain for transistor M1 and the source for transistor M2, N+ doped layer 36 serves as the drain for transistor M2 and the source for transistor M3, and N+ doped layer 38 serves as the drain for transistor M3 and the source for transistor S1. N+ doped layer 22 forms the drain terminal and connects to a common bit line for multiple NAND strings, while N+ doped layer 24 forms the source terminal and connects to a common source line for multiple NAND strings.

Each memory cell can store data represented in analog or digital form. When storing one bit of digital data, the range of possible threshold voltages of the memory cell is divided into two ranges which represent distinct memory states. The memory states are assigned logical data "1" and "0." At least one current breakpoint level is generally established so as to partition the conduction window of the memory cell into the two ranges. When the cell is read by applying predetermined, fixed voltages, its source/drain conduction current is resolved into one of the memory states by comparing it with the breakpoint level (or reference current). If the current read is higher than that of the breakpoint level, the cell is determined to be "on" and in one logical state. If the current is less than the breakpoint level, the cell is determined to be "off" and in the other logical state. In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on to indicate that logic zero is being stored.

A memory cell can also store multiple bits of digital data by utilizing more than two ranges of threshold voltages to represent distinct memory states. The threshold voltage window can be divided into the number of desired memory states and multiple breakpoint levels used to resolve the individual states. For example, if four states are used, there will be four threshold voltage ranges representing four distinct memory states which are assigned the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Memory cells can also be used that stores 3 or more bits of data.

Relevant examples of NAND-type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used in accordance with embodiments.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present technology. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present technology.

Figure 4:
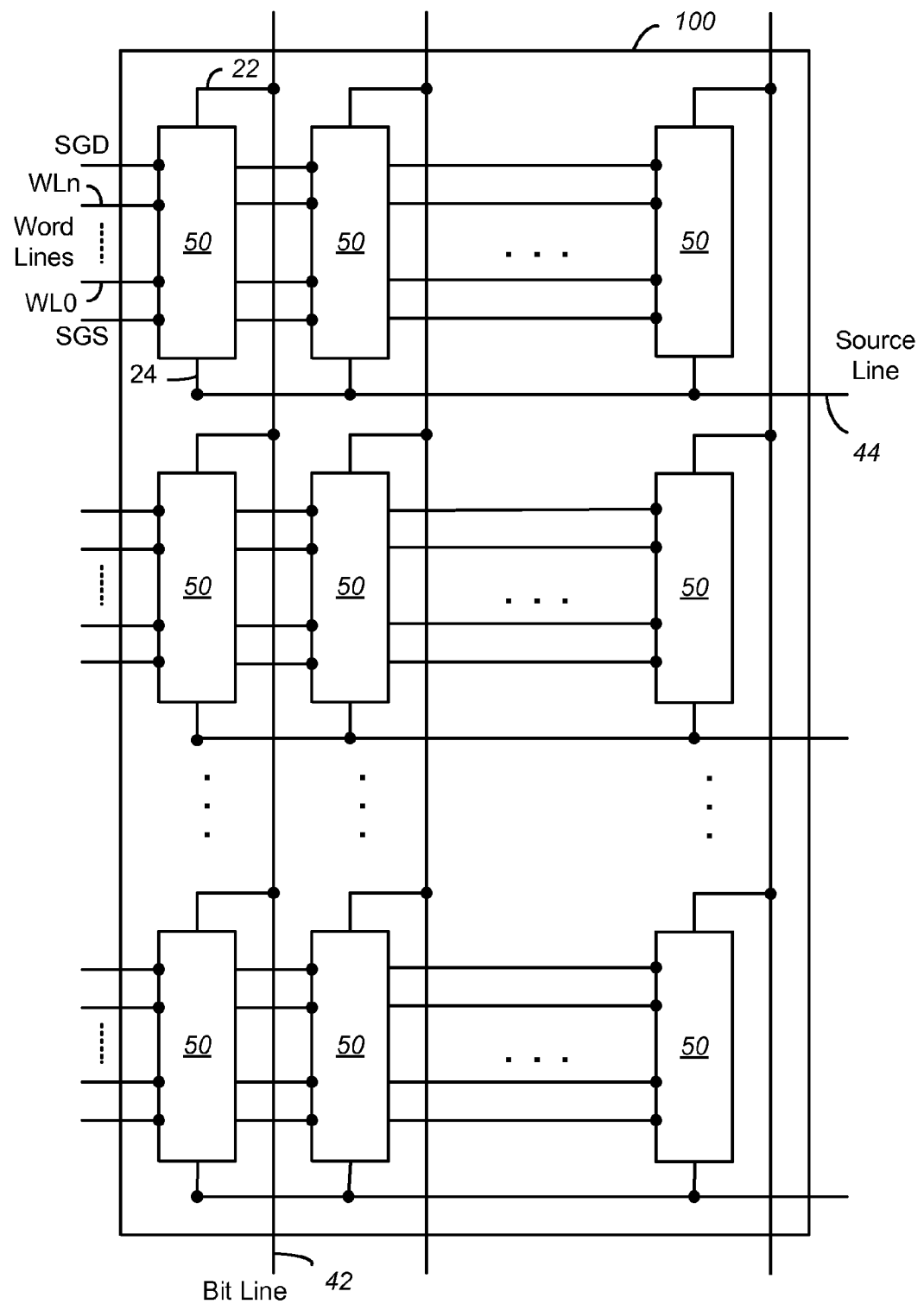
FIG. 4 is a block diagram of an array of NAND flash memory cells.

FIG. 4 illustrates an example of an array 100 of NAND strings 50, such as those shown in FIGS. 1-3. Along each column, a bit line 42 is coupled to the drain terminal, e.g. 22 of the drain select gate for the NAND string 50. Along each row of NAND strings, a source line 44 may connect all the source terminals, e.g. 24 of the source select gates of the NAND strings. An example of a NAND architecture array and its operation as part of a memory system is found in U.S. Pat. Nos. 5,570,315; 5,774,397; and 6,046,935, all of which are incorporated herein by reference in their entirety.

The array 100 of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming or reading, although more than one page may be programmed or read in a single operation. In one embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
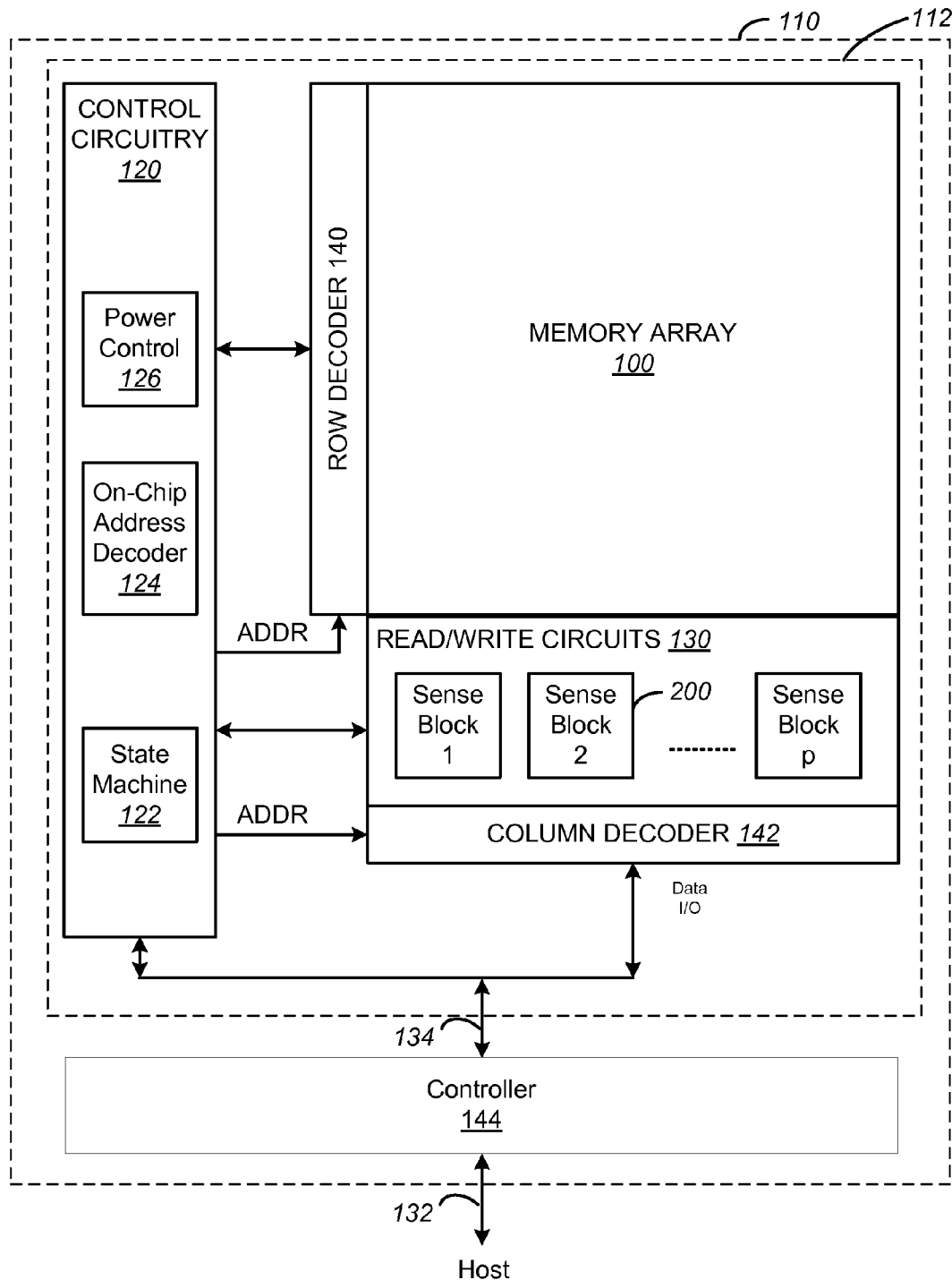
FIG. 5 is a block diagram of a non-volatile memory system.

FIG. 5 illustrates a memory device 110 having read/write circuits for reading and programming a page of memory cells in parallel, according to one embodiment. Memory device 110 may include one or more memory die 112. Memory die 112 includes a two-dimensional array of memory cells 100, control circuitry 120, and read/write circuits 130. The memory array 100 is addressable by word lines via a row decoder 140 and by bit lines via a column decoder 142. The read/write circuits 130 include multiple sense blocks 200 and allow a page of memory cells to be read or programmed in parallel. Typically controller 144 is included in the same memory device 110 (e.g., a removable storage card) as the one or more memory die 112. Commands and Data are transferred between the host and controller 144 via lines 132 and between the controller and the one or more memory die 112 via lines 134.

The control circuitry 120 cooperates with the read/write circuits 130 to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140 and 130. The power control module 126 controls the power and voltages supplied to the word lines and bit lines during memory operations.

Figure 6:
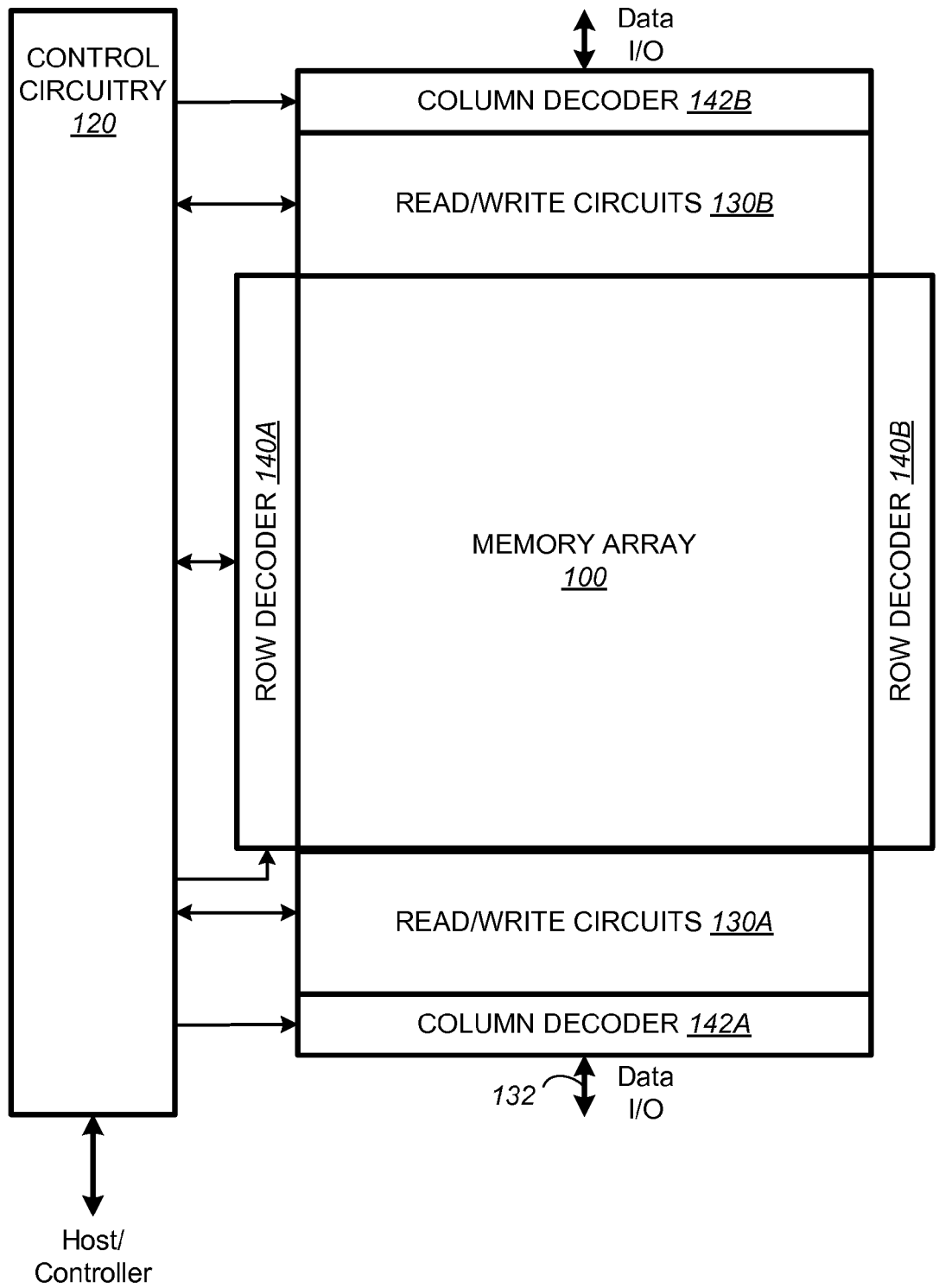
FIG. 6 is a block diagram of a non-volatile memory.

FIG. 6 illustrates another arrangement of the memory device 110 shown in FIG. 5. Access to the memory array 100 by the various peripheral circuits is implemented in a symmetric fashion, on opposite sides of the array, so that the densities of access lines and circuitry on each side are reduced by half. Thus, the row decoder is split into row decoders 140A and 140B and the column decoder into column decoders 142A and 142B. Similarly, the read/write circuits are split into read/write circuits 130A connecting to bit lines from the bottom and read/write circuits 130B connecting to bit lines from the top of the array 100. In this way, the density of the read/write modules is essentially reduced by one half. The device of FIG. 6 can also include a controller, as described above for the device of FIG. 5.

Figure 7:
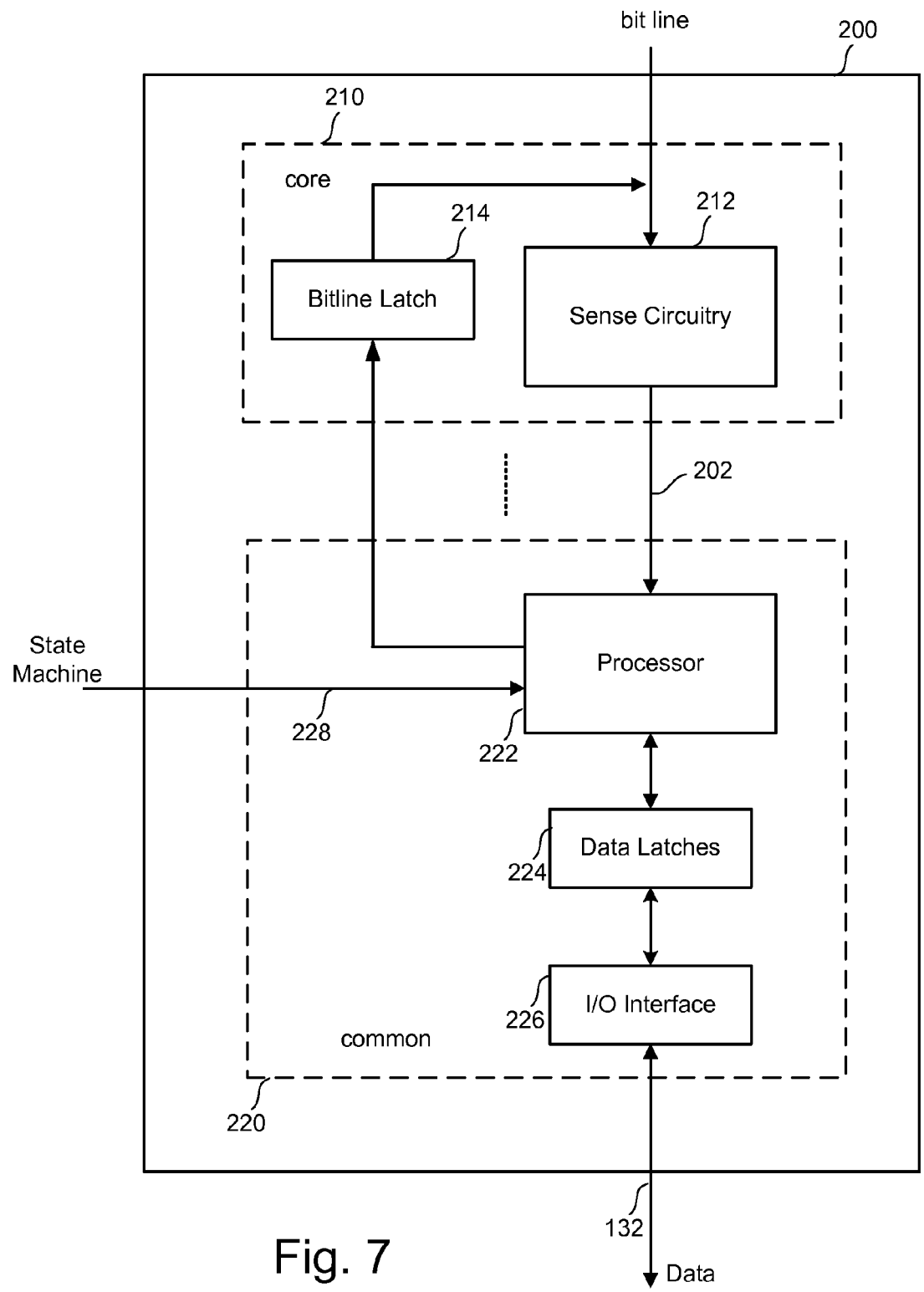
FIG. 7 is a block diagram depicting one embodiment of a sense block of FIGS. 5 and 6.

FIG. 7 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 202. For further details, refer to U.S. patent application Ser. No. 11/026,536, entitled "Non-Volatile Memory & Method with Shared Processing for an Aggregate of Sense Amplifiers," filed on Dec. 29, 2004 and incorporated by reference herein in its entirety.

Sense module 210 comprises sense circuitry 212 that determines whether a conduction current in a connected bit line is above or below a predetermined threshold level. Sense module 210 also includes a bit line latch 214 that is used to set a voltage condition on the connected bit line. For example, a predetermined state latched in bit line latch 214 will result in the connected bit line being pulled to a state designating program inhibit (e.g., Vdd).

Common portion 220 comprises a processor 222, a set of data latches 224 and an I/O Interface 226 coupled between the set of data latches 224 and data bus 132. Processor 222 performs computations. For example, one of its functions is to determine the data stored in the sensed memory cell and store the determined data in the set of data latches. Processor 222 can also perform certain functions dependent upon instructions from the state machine and/or data in latches 224, for example, setting appropriate conditions in bit line latch 214 based on the type of operation being performed. The set of data latches 224 is used to store data bits determined by processor 222 during a read operation. It is also used to store data bits imported from the data bus 132 during a program operation. The imported data bits represent write data meant to be programmed into the memory. I/O interface 226 provides an interface between data latches 224 and the data bus 132.

During read or sensing, the operation of the system is under the control of state machine 122 that controls the supply of different control gate voltages to the addressed cell. As it steps through the various predefined control gate voltages corresponding to the various memory states supported by the memory, the sense module 210 will trip at one of these voltages and an output will be provided from sense module 210 to processor 222 via bus 202. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 214 serves double duty, both as a latch for latching the output of the sense module 210 and also as a bit line latch as described above.

It is anticipated that some implementations will include multiple processors 222. In one embodiment, each processor 222 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one inverted). When all bits output a data 0 (or a data one inverted), then the state machine knows to terminate the programming process. Because each processor communicates with eight sense modules, the state machine needs to read the wired-OR line eight times.

During program or verify, the data to be programmed is stored in the set of data latches 224 from the data bus 132. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate. In other embodiments the processor initially loads the bit line latch 214 and the sense circuitry sets it to an inhibit value during the verify process.

Data latch stack 224 contains a stack of data latches corresponding to the sense module. In one embodiment, there are three data latches per sense module 210. For example, there can be a lower data latch for storing data for a lower page read or write, an upper data latch for storing data for an upper page read or write, and one additional latch. Additional or fewer data latches can be used according to specific implementations in accordance with embodiments. In some implementations (but not required), the data latches are implemented as a shift register so that the parallel data stored therein is converted to serial data for data bus 132, and vice versa. In one embodiment, all the data latches corresponding to the read/write block of n memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 8:
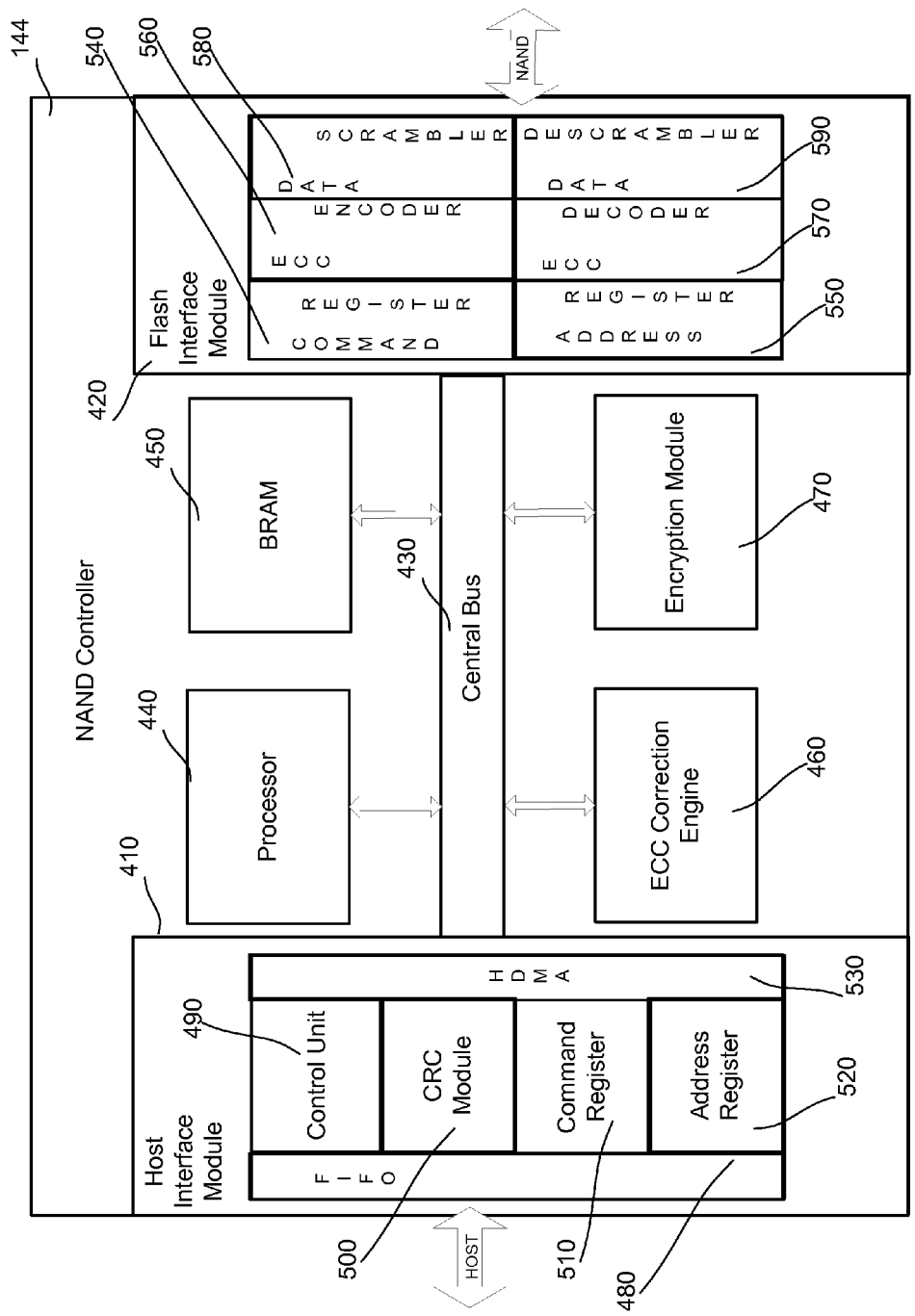
FIG. 8 shows an exemplary controller configured to perform methods disclosed herein.

FIG. 8 is a diagram of one possible implementation of controller 144 of FIG. 5. Other implementations can also be used. In some embodiments, controller 144 may be used to perform methods disclosed herein. It should be understood that any of the components shown in these drawings can be implemented as hardware, software/firmware, of a combination thereof. The Host Interface Module (HIM) 410 is a collection of logic that supports the "host side interface" as a "flash device-type interface." The HIM 410 comprises a first-in-first-out ("FIFO") module 480, a control unit 490, a cyclic redundancy check ("CRC") module 500 (although another type of error detection code ("EDC") module can be used), a command register 510, an address register 520, and a host direct memory access ("HDMA") unit 530. Some implementations of an HIM receive a high-level request from a host controller for a relatively large amount of data that spans several pages, and controller 144 determines what actions are needed to satisfy the request. Other embodiments of an HIM receive several smaller-sized requests (e.g. for individual pages) from a host controller, so the HIM is required to simultaneously handle multiple (e.g., eight) read and write requests.

Flash Interface Module (FIM) 420 is implemented as a collection of logic and a low-level programmable sequencer that creates the "device side interface" as a "host-type interface." In this embodiment, the FIM 420 comprises a command register 540, an address register 550, an ECC encode module 560, an ECC decode module 570, a data scrambler 580, and a data descrambler 590.

Internal to controller 144 is a processor 440, which has local ROM, code RAM, and data RAM. The central bus 430 connects the processor 440, the HIM 410, the FIM 420, and the other module described below, and is used to transfer data between the different modules shown. This bi-directional bus 430 may be either an electrical bus with actual connections to each internal component or an Advanced High-Speed Bus ("AHB") used in conjunction with an ARC microprocessor, which logically connects the various modules using an interconnect matrix. The central bus 430 can transmit data, control signals, or both. Controller 144 also comprises a buffer RAM ("BRAM") 450 that is used to temporarily store pages of data that are either being read or written, and an ECC correction engine 460 for correcting errors. Controller 144 further comprises an encryption module 470 for performing encryption/decryption functions.

Controller 144 can further comprise a column replacement module, which is implemented here by either the FIM sequencer, firmware in the processor 440, or in a small amount of logic and a table located in the FIM 420. The column replacement module allows flash memory device(s) to contain information on bad column locations. The bad column address information is contained in flash memory devices and is scanned by firmware prior to any read or write operation. After firmware scans the flash memory device(s), it builds a bad column address table with the bad column location to be used by the column replacement module. On flash write operations, the column replacement module inserts the data for the address that is detected in a bad column address table. On flash read operations, data from the bad column address will be discarded.

With the components of controller 144 now generally described, exemplary write and read operations of controller 144 will now be presented. Turning first to a write operation, the FIFO 480 in the HIM 410 acts as a buffer for an incoming write command, address, and data from a host controller and synchronizes those elements to the system card domain. The CRC module 500 checks the incoming information to determine if any transmission errors are present. (The CRC module 500 is an example of the EDC module discussed above.) The CRC module generates or checks an error detection code to check for transmission errors as part of an end-to-end data protection scheme. If no errors are detected, the control unit 490 decodes the command received from the FIFO 480 and stores it in the command register 510, and also stores the address in the address register 520. The data received from the host controller is sent through the HDMA AHB interface 530 to the BRAM 450 via the central bus 430. The control unit 490 sends an interrupt to the processor 440, in response to which the processor 440 reads the command from the command register 510 and the address register 520 and, based on the command, sets up the data path in the FIM 420 and stores the command in the FIM's command register 540. The processor 440 also translates the address from the address register 520 into an internal NAND address and stores it in the FIM's address register 550. If logical-to-physical address conversion is to be performed, the processor 440 can use a mapping table to create the correct physical address. The processor 440 can also perform one or more additional functions described below. The processor 440 then sets up a data transfer from the BRAM 450 to the FIM 420.

The FIM 420 takes the value from the address register 150 and formats it in accordance with the standard of the NAND interface with which FIM 420 communicates. The data stored in BRAM 450 is sent to the encryption module 470 for encryption and is then sent through the data scrambler 580. The data scrambler 580 scrambles the data and outputs the data to the FIM's ECC encoder 560, which generates the ECC parity bits to be stored with the data. The data and ECC bits are then transferred over the NAND interface with the write command to the flash memory device(s) for storage. As an example of an additional function that may occur during writes, if protection for write aborts or program failures is enabled and if the write request is to an upper page address, the processor 440 can send a read command to flash memory device(s) over the NAND interface for the corresponding lower page and then send a program command to have it copied into a safe zone (a spare scratchpad area) by writing it back to another location in the flash memory devices. If an error occurs in writing the upper page, the lower page can still be read back from the safe zone and the error corrected.

Turning now to a read operation, HIM 410 receives a read command from a host controller, and the processor 440 reads the command and logical address. If logical-to-physical address conversion is to be performed, the firmware in the processor 440 could use a mapping table to create the correct physical address. (This is an example of the address mapping module discussed above.) The firmware then sends the physical address over the NAND interface to a flash memory device. After the read access, the data is transferred over the NAND interface, decoded and used to generate the syndrome data for error correction, descrambled by the data descrambler 590, and then sent over the central bus 430 to the BRAM 450. The ECC correction engine 460 is used to correct any errors that can be corrected using the ECC on the data that is stored in the BRAM 450. Since the ECC may be computed and stored in portions of a physical page, the processor 440 can be interrupted as each portion of the page is received or corrected, or once when all of the data is transferred. The encryption module 470 then performs a decryption operation on the data. The timing described above is flexible since the host interface and NAND interface may operate at different speeds, and the firmware can transfer the data using either store-and-forward techniques or speed-match buffering. When the data is sent back to the host controller it is sent through the HIM 410, and the transmission CRC is sent back to the host over the host interface to check for transmission error.

As mentioned above, in addition to handling commands sent from the host controller, the processor 440 may perform one or more additional functions asynchronously or independent of any specific command sent by the host. For example, if the ECC correction engine 460 can correct the soft error and also interrupt the processor 440 to log the page location so that the corresponding block could be read scrubbed at a later point in time. Other exemplary background tasks that can be performed by the processor 440 are wear leveling and mapping of bad blocks and spare blocks.

Figure 9:
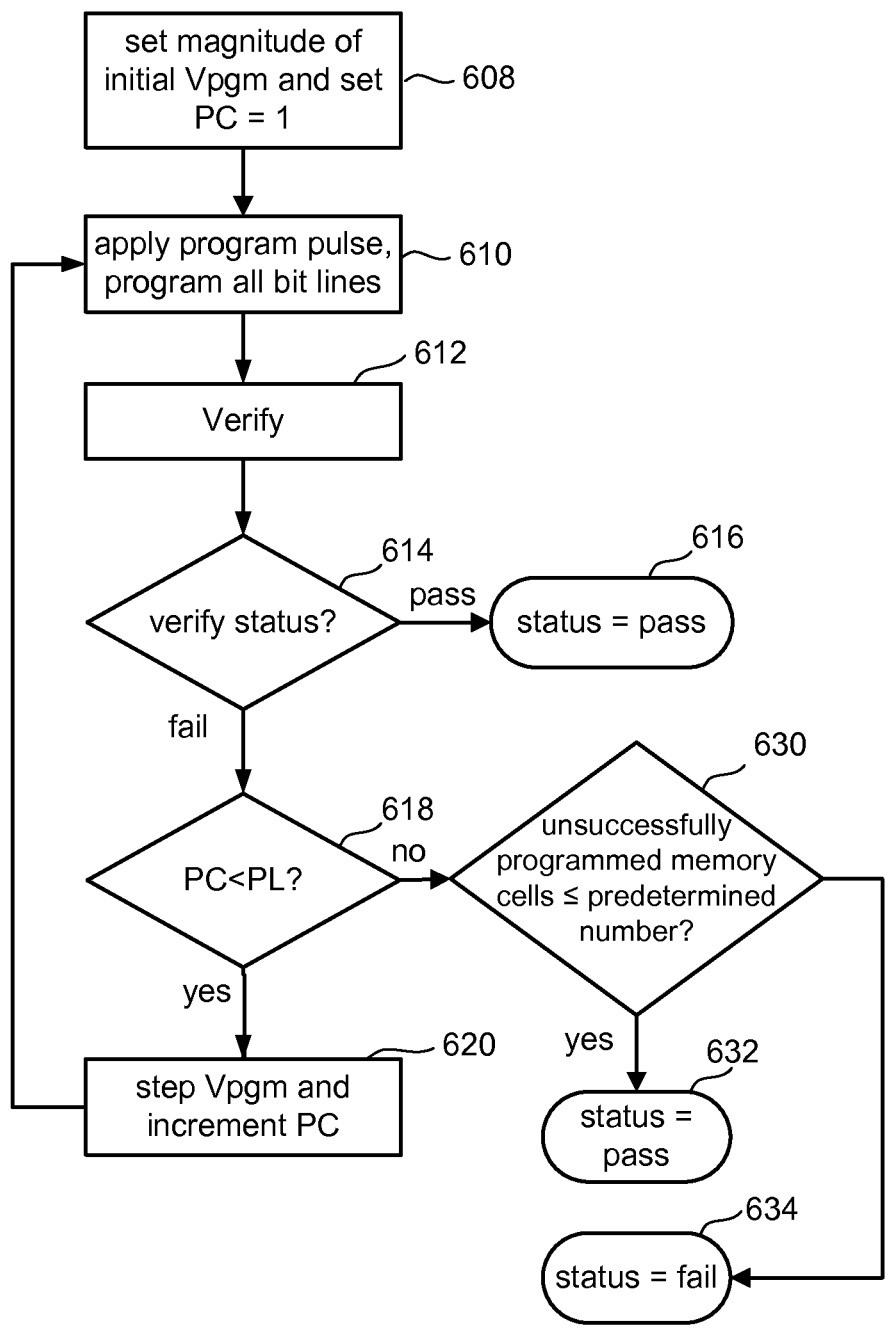
FIG. 9 is a flow chart describing one embodiment of a process for programming non-volatile memory

FIG. 9 is a flow chart describing one embodiment of a method for programming non-volatile memory. In one implementation, memory cells are erased (in blocks or other units) prior to programming. The process of FIG. 9 is performed at the direction of the state machine 122.

Figure 10:
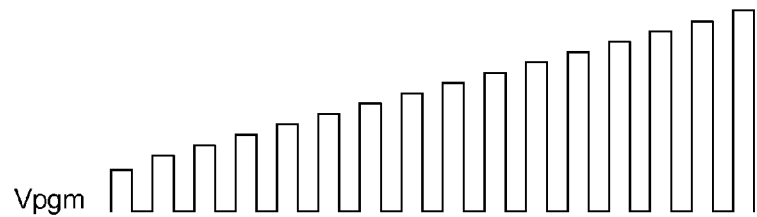
FIG. 10 is a waveform of programming pulses applied in one embodiment of a process for programming non-volatile memory.

Typically, the program voltage applied to the control gate during a program operation is applied as a series of program pulses, such as those shown in FIG. 10. In between programming pulses are a set of verify pulses to enable verification. In many implementations, the magnitude of the program pulses is increased with each successive pulse by a predetermined step size. In step 608 of FIG. 9, the programming voltage (Vpgm) is initialized to the starting magnitude (e.g., ~12-16V or another suitable level) and a program counter PC maintained by state machine 122 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 9 includes performing one or more verify operations. In general, during verify operations and read operations, the selected word line is connected to a voltage, a level of which is specified for each read (e.g., see read compare levels Vra, Vrb, and Vrc of FIG. 11) and verify operation (e.g. see verify levels Vva, Vvb, and Vvc of FIG. 11) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; and (4) U.S. Patent Publication 2006/0221692, titled "Compensating for Coupling During Read Operations of Non-Volatile Memory," Inventor Jian Chen, filed on Apr. 5, 2005.

If it is detected that the threshold voltage of a selected memory cell has reached the appropriate target level, then the memory cell is locked out of further programming by, for example, raising its bit line voltage to Vdd during subsequent programming pulses.

Looking back at FIG. 9, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 632. In many cases, the memory cells that are not successfully programmed can be corrected using error correction during the read process. If however, the number of unsuccessfully programmed memory cells is greater than the predetermined number, the program process is flagged as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line.

Figure 11:
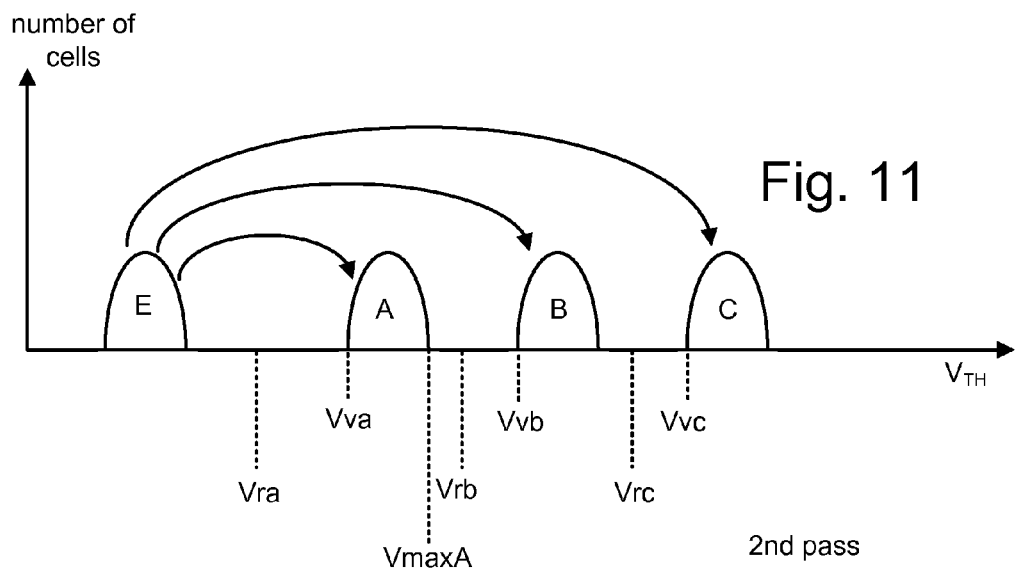
FIG. 11 depicts an exemplary set of threshold voltage distributions.

At the end of a successful program process, the threshold voltages of the memory cells should be within one or more distributions of threshold voltages for programmed memory cells or within a distribution of threshold voltages for erased memory cells, as appropriate. FIG. 11 illustrates threshold voltage distributions for the memory cell array when each memory cell stores two bits of data. FIG. 11 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 11 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present technology can also be used with other multi-state structures including those that include more or less than four states.

When reading data from memory cells connected to a word line selected for reading, the read voltage applied to the word line selected for reading will be known hereinafter as "Vcgr." FIG. 11 also shows three values for Vcgr, Vra, Vrb and Vrc, for reading data from memory cells. By testing whether the threshold voltage of a given memory cell is above or below Vra, Vrb and Vrc, the system can determine what state the memory cell is in. FIG. 11 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment as depicted in FIG. 11, known as full sequence programming, memory cells can be programmed from the erase state E directly to any of the programmed states A, B or C. For example, a population of memory cells to be programmed may first be erased so that all memory cells in the population are in erased state E. The process depicted in FIG. 9, using the control gate voltage sequence depicted in FIG. 10, will then be used to program memory cells directly into states A, B or C. While some memory cells are being programmed from state E to state A, other memory cells are being programmed from state E to state B and/or from state E to state C.

Figure 12:
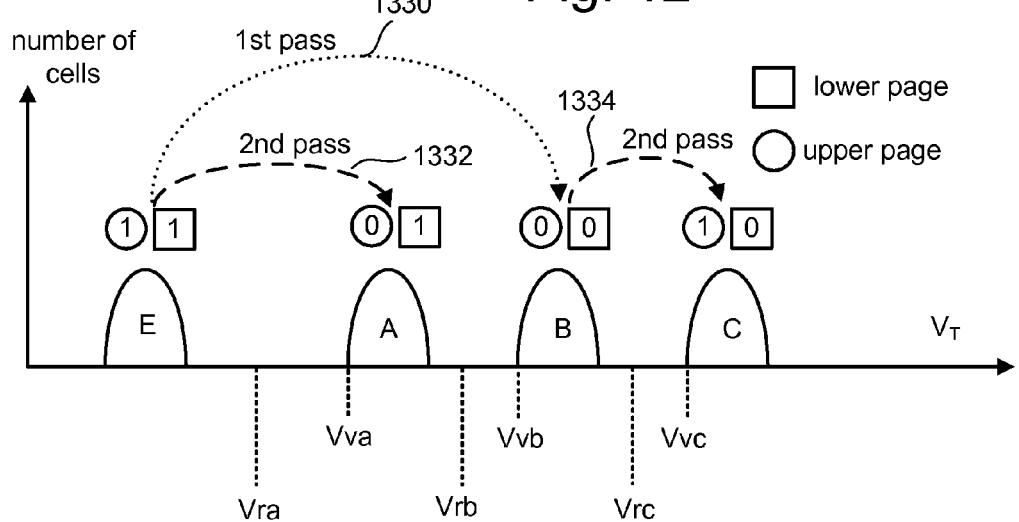
FIG. 12 depicts an exemplary set of threshold voltage distributions.

FIG. 12 illustrates an example of a two-pass technique of programming a multi-state memory cell that stores data for two different pages: a lower page and an upper page. Four states are depicted: state E (11), state A (01), state B (00) and state C (10). For state E, both pages store a "1." For state A, the upper page stores a "0" and the lower page stores a "1." For state B, both pages store "0." For state C, the upper page stores "1" and the lower page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state B, as shown by arrow 1330. That concludes the first programming pass.

In a second programming pass, the cell's threshold voltage level is set according to the bit being programmed into the upper logical page. If the lower page stores a "1" and the upper logical page bit is to store a "1," then no programming occurs since the cell is already in state E. If the lower page stores a "0" and the upper logical page bit is to store a "0," then no programming occurs since the cell is already in state B. If the lower page stores a "1" and the upper logical page bit is to store a "0," then the memory cells receives programming to shift the threshold voltage from state E to state A. If the lower page stores a "0" and the upper logical page bit is to store a "1," then the memory cells receives programming to shift the threshold voltage from state B to state C.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 13A:
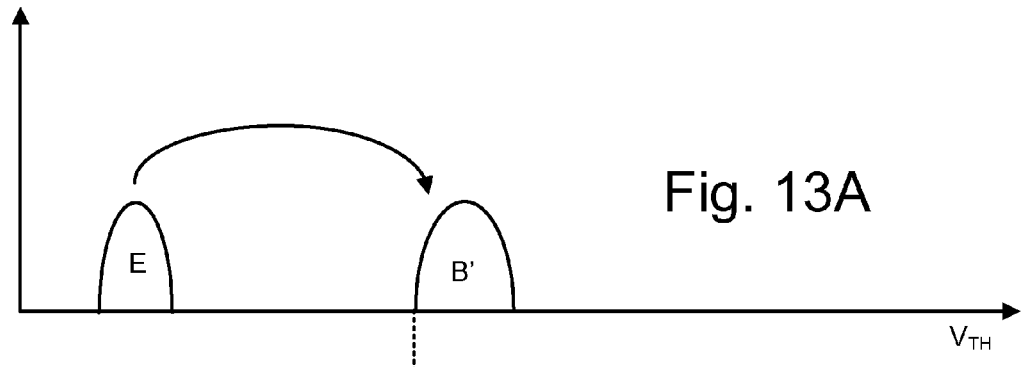
FIGS. 13A-13C show exemplary threshold voltage distributions and describe an exemplary process for programming non-volatile memory.
Figure 13B:
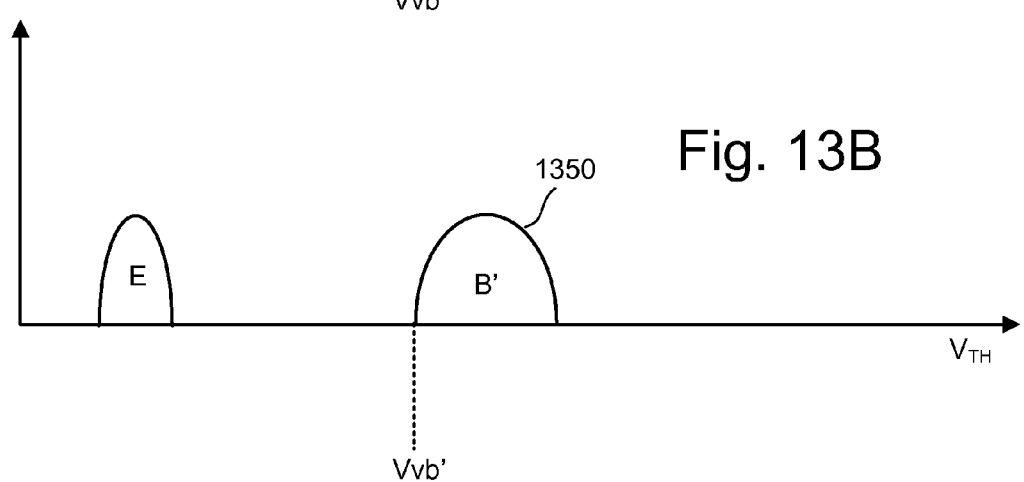
Figure 13C:
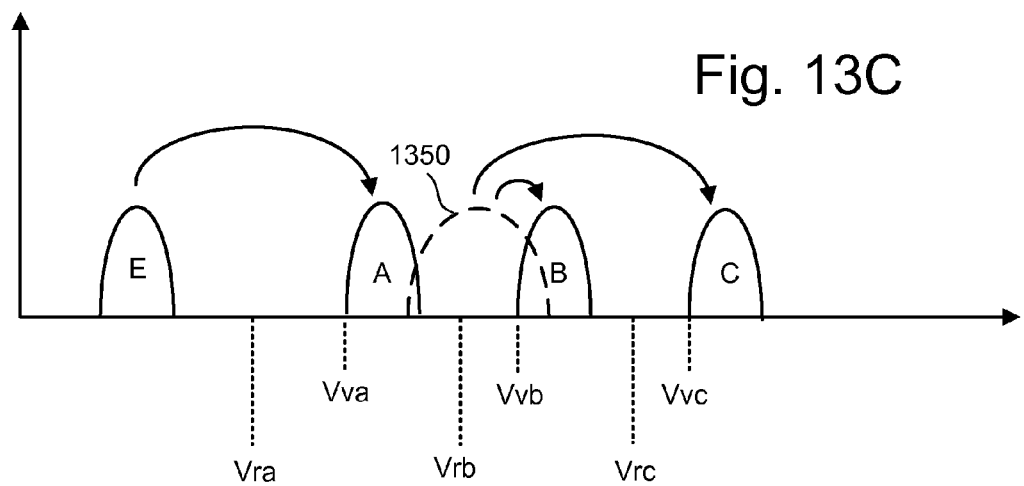

FIGS. 13A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 13A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores data for two pages. For reference purposes these pages of data will be called upper page and lower page, however, they can be given other labels. With reference to state A for the process of FIGS. 13A-C, the upper page stores bit 0 and the lower page stores bit 1. With reference to state B, the upper page stores bit 1 and the lower page stores bit 0. With reference to state C, both pages store bit data 0. The programming process of FIGS. 13A-C is a two-step process. In the first step, the lower page is programmed. If the lower page is to remain data 1, then the memory cell state remains in state E. If the data is to be programmed to 0, then the threshold of voltage of the memory cell is raised such that the memory cell is programmed to state B'. FIG. 13A therefore shows the programming of memory cells from state E to state B'. State B' depicted in FIG. 13A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 2, after the lower page for memory cell M0 is programmed, the lower page for memory cell M1 would be programmed. After programming memory cell M1, the floating gate to floating gate coupling effect will raise the apparent threshold voltage of memory cell M0 if memory cell M1 had a threshold voltage raised from state E to state B'. This will have the effect of widening the threshold voltage distribution for state B' to that depicted as threshold voltage distribution 1350 of FIG. 13B. This apparent widening of the threshold voltage distribution will be remedied when programming the upper page.

FIG. 13C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 1350 and the upper page data is to remain at 1, then the memory cell will be programmed to final state B. If the memory cell is in intermediate threshold voltage distribution 1350 and the upper page data is to become data 0, then the threshold voltage of the memory cell will be raised so that the memory cell is in state C. The process depicted by FIGS. 13A-C reduces the effect of floating gate to floating gate coupling because only the upper page programming of neighbor memory cells will have an effect on the apparent threshold voltage of a given memory cell. An example of an alternate state coding is to move from distribution 1350 to state C when the upper page data is a 1, and to move to state B when the upper page data is a 0.

Although FIGS. 13A-C provide an example with respect to four data states and two pages of data, the concepts taught by FIGS. 13A-C can be applied to other implementations with more or less than four states and different than two pages.

Figure 14:
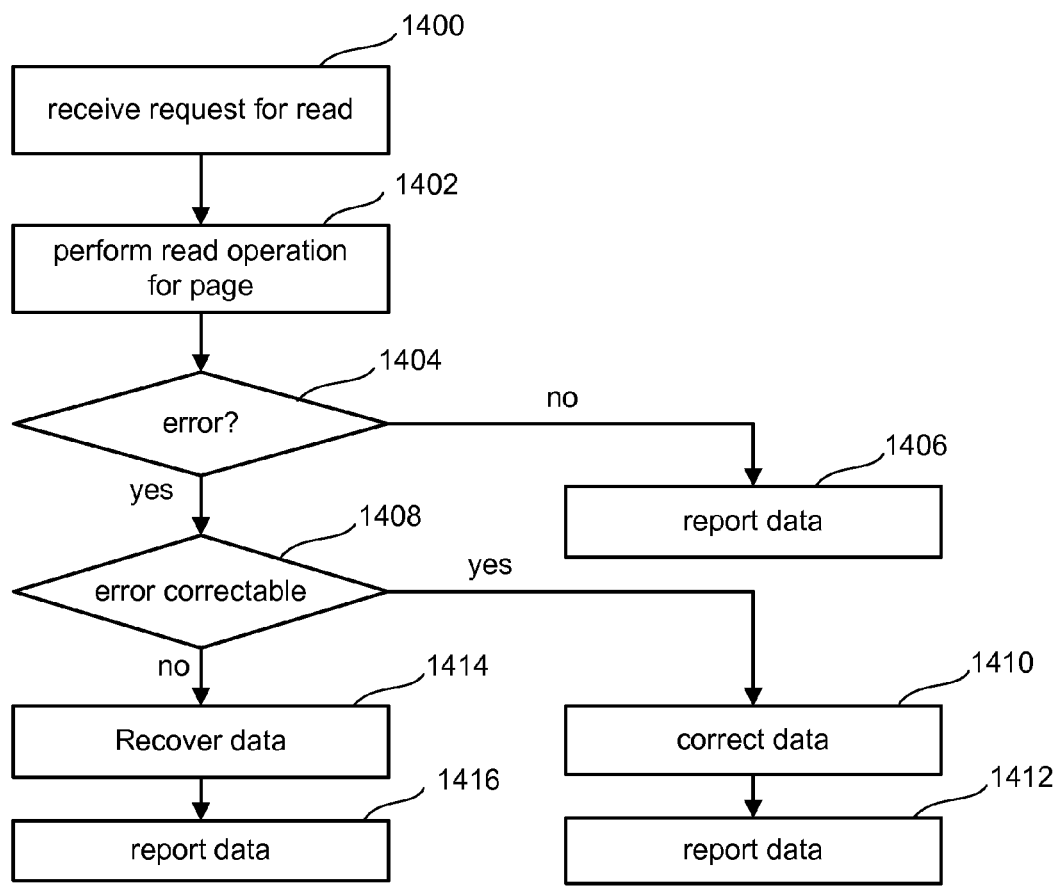
FIG. 14 is a flow chart describing one embodiment of a process for reading non-volatile memory.

FIG. 14 is a flow chart describing one embodiment for reading data from non-volatile memory cells. At step 1402, a read operation is performed for a particular page in response to a request to read data (step 1400). In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page, the ECCs will be used to determine whether there are any errors in the data (step 1404). If there are no errors in the data, the data is reported to the user at step 1406. For example, data will be communicated to a controller or host via data I/O lines 132. If an error is found at step 1404, it is determined whether the error is correctable (step 1408). Various ECC methods have the ability to correct a predetermined number of errors in a set of data. If the ECC process can correct the data, then the ECC process is used to correct that data in step 1410 and the data, as corrected, is reported to the user in step 1412. If the data is not correctable by the ECC process, a data recovery process is performed in step 1414. In some embodiments, an ECC process will be performed after step 1414. More details about the data recovery process are described below. After the data is recovered, that data is reported at step 1416.

Figure 15:
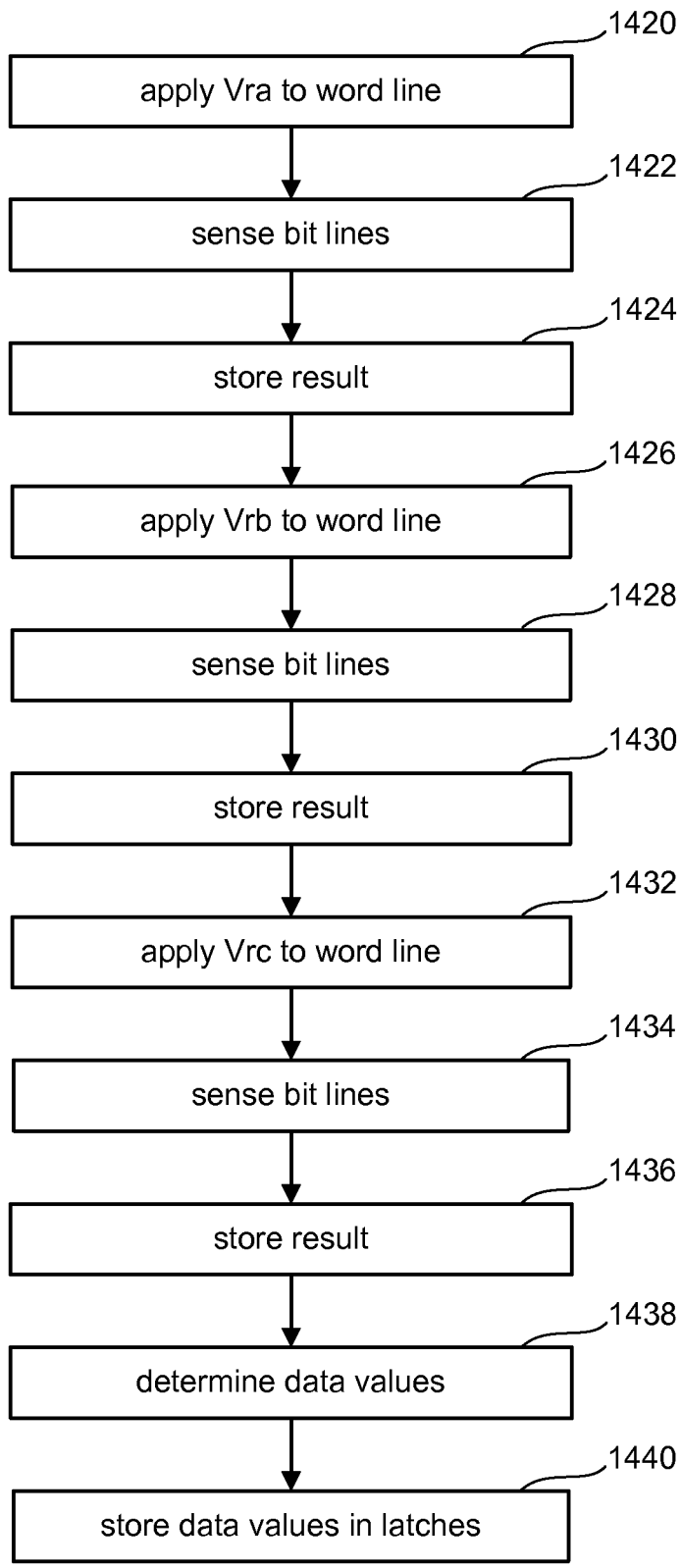
FIG. 15 is a flow chart describing one embodiment of a process for reading multiple pages of data from non-volatile memory.

FIG. 15 is a flow chart describing one embodiment of a process for performing a read operation for a page (see step 1402 of FIG. 14). The process of FIG. 15 can be performed for a page that encompasses all bit lines of a block, only odd bit lines of a block, only even bit lines of a block, or other subsets of bit lines of a block. In step 1420, the Vcgr value Vra is applied to the appropriate word line associated with the page. This word line is the word line selected for reading. In contrast, the other word lines in the block are unselected word lines. When Vcgr is applied to the word line selected for reading, the unselected word lines (except for those unselected word lines adjacent to the word line selected for reading) in the block receive voltage Vread, which is generally a few volts higher than Vcgr. Typically when Vcgr is applied to the word line selected for reading, the unselected word lines adjacent to the word line selected for reading receive voltage VreadK, which is slightly higher than Vread. More detail will be provided later. In step 1422, the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E). In step 1424 the result of the sensing for the bit lines is stored in the appropriate latches for those bit lines. In step 1426, Vcgr value Vrb is applied to the word lines associated with the page being read. In step 1428, the bit lines are sensed as described above. In step 1430, the results are stored in the appropriate latches for the bit lines. In step 1432, Vcgr value Vrc is applied to the word lines associated with the page. In step 1434, the bit lines are sensed to determine which memory cells conduct, as described above. In step 1436, the results from the sensing step are stored in the appropriate latches for the bit lines. In step 1438, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 222. In step 1440, processor 222 will store the determined data values in the appropriate latches for each bit line. In other embodiments, sensing the various levels (Vra, Vrb, and Vrc) may occur in different orders. The process of FIG. 15 is for memory cells with two bits of data. Other read processes can be used for memory cells storing more than two bits of data. Other read processes can be also used for memory cells storing two bits of data.

Different number of Vcgr values may be applied in various embodiments based on the coding and/or architecture employed. For example, when an upper page/lower page architecture is employed and a coding scheme as illustrated in FIG. 11 used, an upper page read may be accomplished simply by using the Vrb value of Vcgr to determine whether a memory cell is in one of states E and A (upper page bit=1) or in one of states B and C (upper page bit=0). A lower page read may be accomplished by using the Vra and Vrc values of Vcgr to determine whether a memory cell is in one of states E and C (lower page bit=1) or one of states A and B (lower page bit=0). In an example using an upper page lower page architecture and a coding scheme as depicted in FIGS. 13A-13C, a lower page read may be accomplished by using the Vrb value of Vcgr to determine whether a memory cell is in one of states E and A (lower page bit=1) or in one of states B and C (lower page bit=0). An upper page read for such an embodiment may be accomplished using the Vra and Vrc values of Vcgr.

Figure 16:
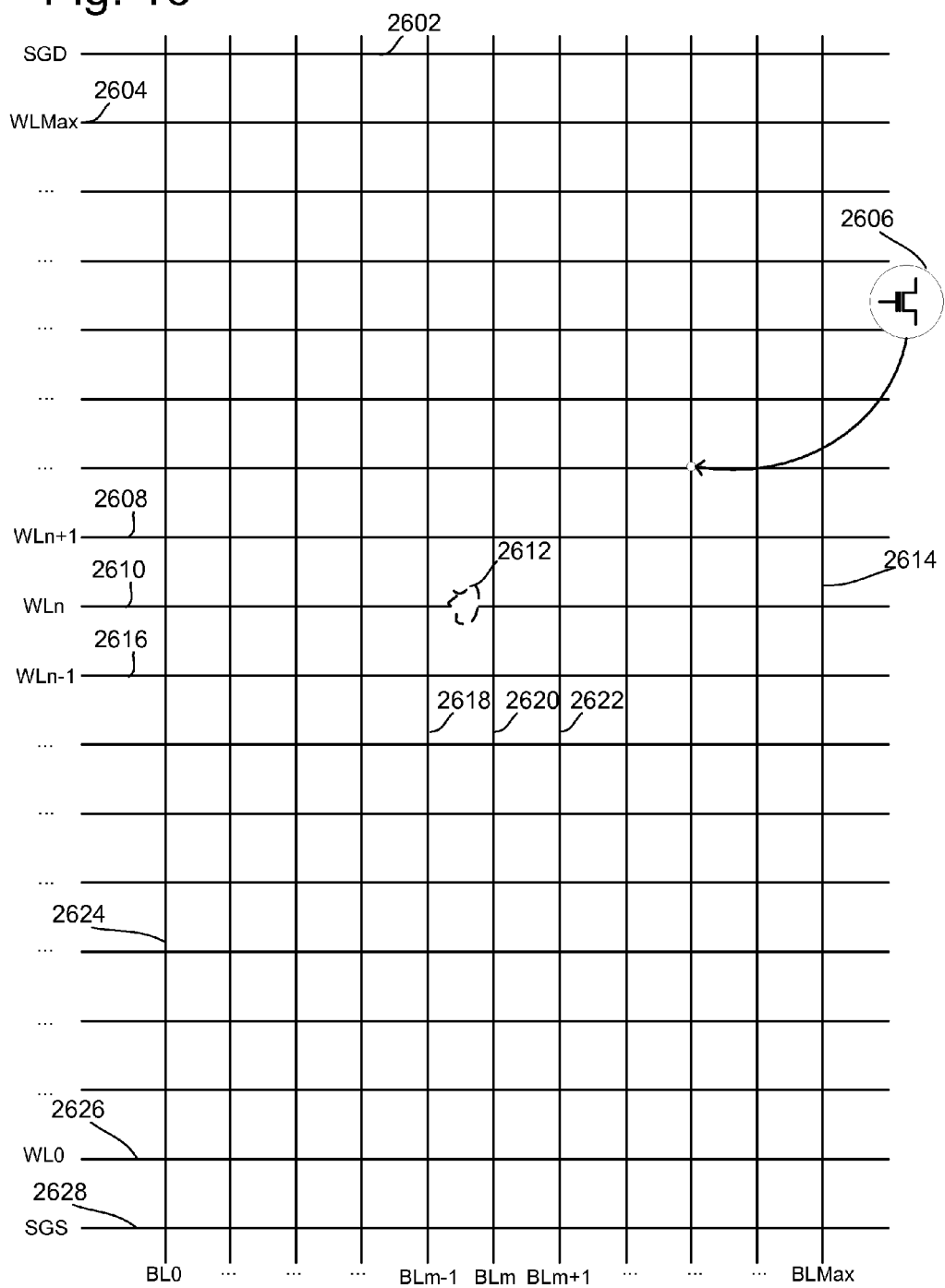
FIG. 16 depicts a grid of word lines and bit lines in a block.

FIG. 16 depicts a grid of word lines and bit lines in a block. FIG. 16 is similar to the depiction of NAND strings in FIG. 4, but presented in a way to relate the NAND memory structure more closely to the disclosed technology. The horizontal lines represent word lines and the vertical lines represent bit lines. Line 2628 is select line SGS and line 2602 is select line SGD. Line 2626 is WL0, the first word line to be programmed and on the source side of the block. Line 2604 is WLMax, the last word line to be programmed and on the drain side of the block. Line 2610 is an arbitrary word line WLn (where "n" is the index of the word line in the order from source to drain), line 2608 is the word line WLn+1, neighboring WLn on the drain side, and line 2612 is the word line WLn−1, neighboring WLn on the source side. Similarly, line 2624 is BL0, the leftmost bit line. Line 2614 is BLMax, the rightmost bit line. Furthermore, line 2620 is an arbitrary bit line BLm (where "m" is the index of the bit line in order from left to right), line 2618 is the bit line BLm−1, neighboring BLm on the left, and line 2622 is the bit line BLm+1, neighboring BLm+1 on the right.

At every point at which a word line and bit line intersect lies a memory cell, as shown by memory cell 2606. Area 2612 represents a break in line 2610, word line WLn. Various thermal and mechanical causes involved in the manufacture of memory systems can result in a break in a word line. Electrically, a break in a word line creates an increased resistance or even a full open circuit in the word line, depending on the severity of the break. Since the word line is a wire to deliver charge to the control gates of memory cells connected to the word line, breaks in the word line delay or prevent the system from adequately delivering charge to the control gates of these memory cells under normal operation. Breaks in word lines can result in errors when data is read from the memory cells connected to the broken word lines using normal read operations. These errors may not be correctable using ECC, so the read operation itself must be adjusted to properly read data when there is a broken word line. In the example presented in FIG. 16, memory cells connected to line 2610 may not be read successfully using normal read operations due to the break in area 2612 of WLn.

Additionally, a broken word line can create problems even for reading memory cells that are not connected to the broken word line. In order to a memory cell in a NAND string to be sensed, at least a certain amount of current must be conducted through the bit line to which the memory cell is conducted. Therefore, the other memory cells connected to the same bit line must act as pass gates. If the control gates of memory cells connected to a broken word line cannot be adequately charged under normal operation, the voltage on the control gates may not rise above the threshold voltage of the memory cells, thereby preventing the bit lines from conducting. Thus, memory cells other than those connected to a broken word line may produce read errors when read by standard read operations.

Figure 17:
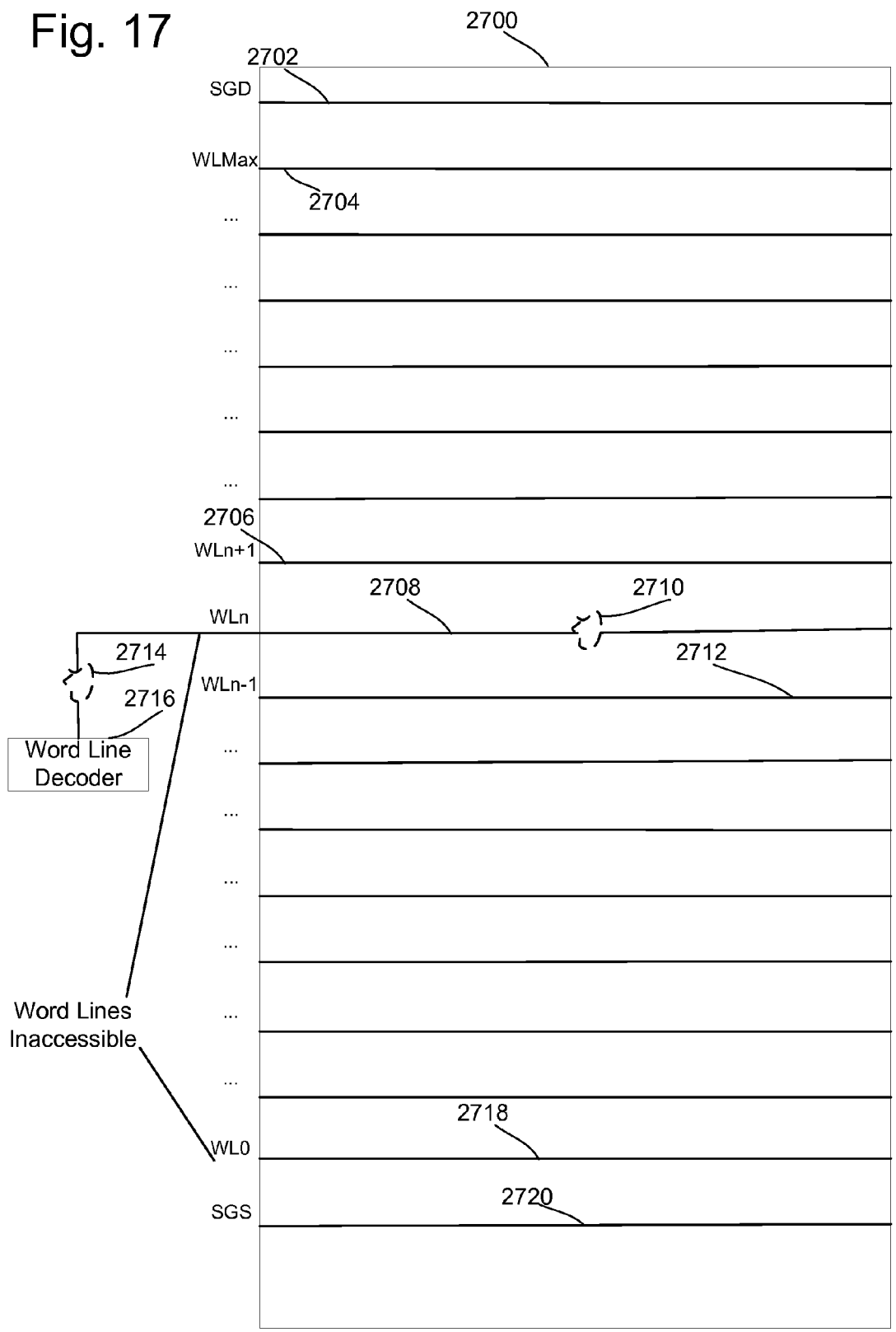
FIG. 17 is a depiction of the word lines in a block with a broken word line.

FIG. 17 is another depiction of the word lines in a block, and how a broken word line can affect read operations. In FIG. 17, lines 2702 (SGD) and 2704 (WLMax) of block 2700 correspond to lines 2602 and 2604 of FIG. 16, respectively. Lines 2718 (WL0) and 2720 (SGS) correspond to lines 2626 and 2628 of FIG. 16, respectively. Lines 2706 (WLn+1), 2708 (WLn), and 2712 (WLn−1) correspond to lines 2608, 2610, and 2616 of FIG. 16, respectively. The bit lines of block 2700 are not shown.

FIG. 17 also shows breaks in line 2708 (WLn) in areas 2710 and 2714. While word lines generally do not break in more than one place (though they might), for the purposes of illustration, FIG. 17 shows a break (2710) both in the memory array and another break (2714) near the circuit of word line decoder 2716, two locations where breaks in a word line may occur. In a situation such as the one depicted in FIG. 17, if WLn has one or more breaks, but no word lines on the drain side of WLn have any such defects, then while line 2702 (SGD) still functions to allow bit lines to conduct current through the drains of the memory cells connected from lines 2704 (WLMax) down to line 2706 (WLn+1), the breaks in areas 2710 and 2714 on line 2708 (WLn) prevent the drains of memory cells connected to lines 2718 (WL0) through 2708 (WLn) from connecting to the bit lines, rendering these memory cells inaccessible.

Figure 18:
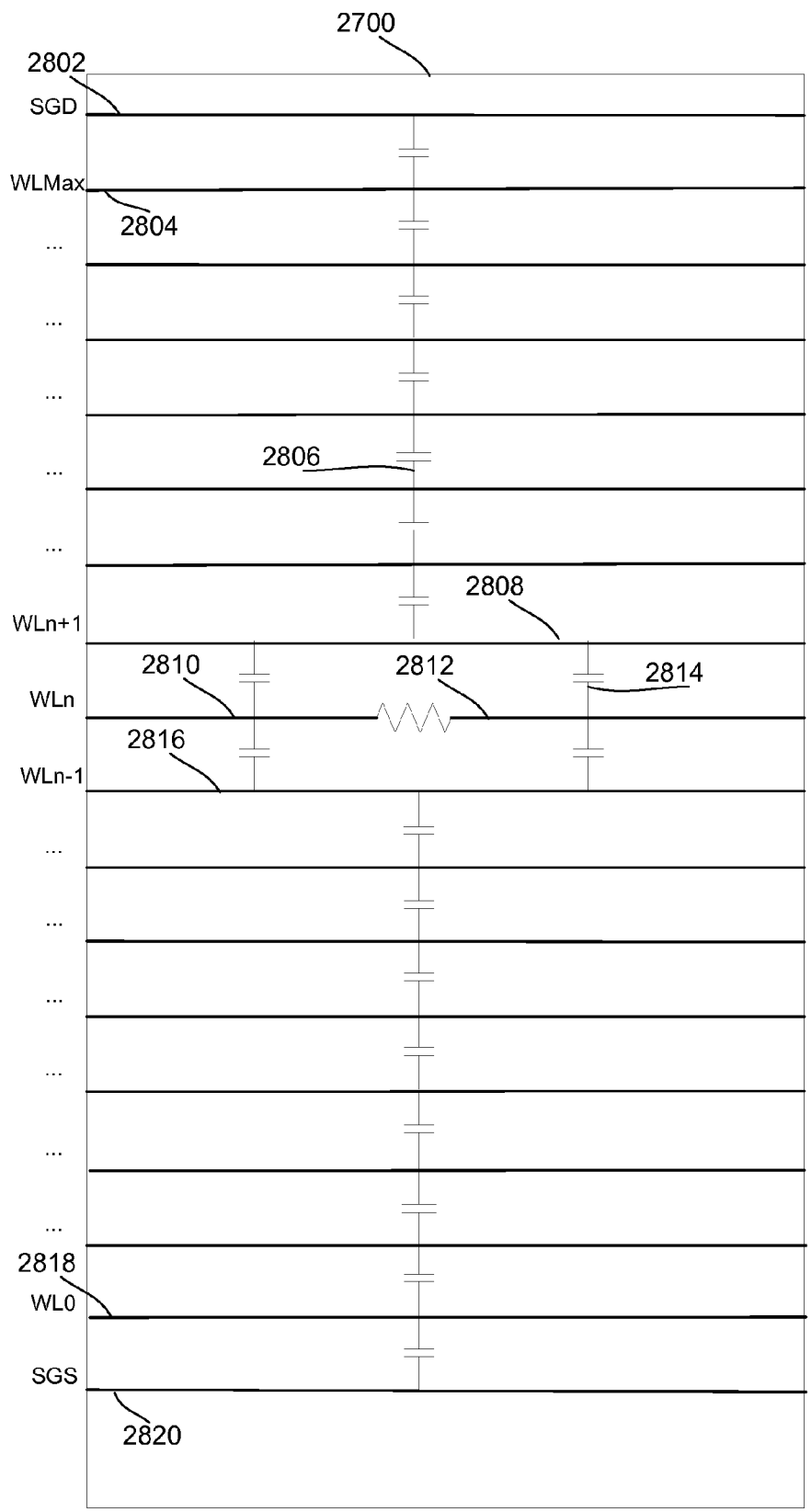
FIG. 18 is a circuit-level depiction of the word lines in a block.

FIG. 18 provides a circuit-level depiction of the word lines of block 2700 of FIG. 17. In FIG. 18, lines 2802 (SGD) and 2804 (WLMax) of block 2700 correspond to lines 2702 and 2704 of FIG. 17, respectively. Lines 2818 (WL0) and 2820 (SGS) correspond to lines 2718 and 2720 of FIG. 17, respectively. Lines 2808 (WLn+1), 2810 (WLn), and 2816 (WLn−1) correspond to lines 2706, 2708, and 2712 of FIG. 17, respectively. The bit lines of block 2700 are not shown.

Capacitor 2806 represents a capacitive coupling between two neighboring word lines, and capacitive coupling exists between all pairs of neighboring word lines, as shown. In particular, capacitor 2814 shows that line 2810 (WLn) coupled to line 2808 (WLn+1), though, as shown, line 2810 couples with both its neighbors, 2808 and 2816 (WLn−1). Through the series network depicted in FIG. 18, every word line in block 2700 exhibits some degree of capacitive coupling with every other word line in memory 2700. Because WLn is broken, the capacitive coupling of WLn to its neighbors may be increased.

In FIGS. 16 and 17, it is shown that WLn is broken. In FIG. 18, this break is represented by resistor 2812, which is depicted to connect both sides of line 2810. When breaks occur in word lines, the word line, which is normally a highly conductive wire connecting a circuit such as decoder 2716 to the control gates of memory cells, rises in resistance by tenfold or more. Because there is capacitive coupling between the control gate of a memory cell and the floating gate of the memory cell, the RC delay seen by the circuit charging the control gate is increased by a break in the word line. This delay may prevent the memory cell from being raised above the threshold voltage in the time allotted in normal read operations. Thus, broken word lines can result in errors in the data read by normal read operations. Furthermore, once the broken word line is charged to the voltage appropriate for the read operation being conducted, the increased resistance from the break also delays the discharging of the word line to a lower voltage.

Figure 19A:
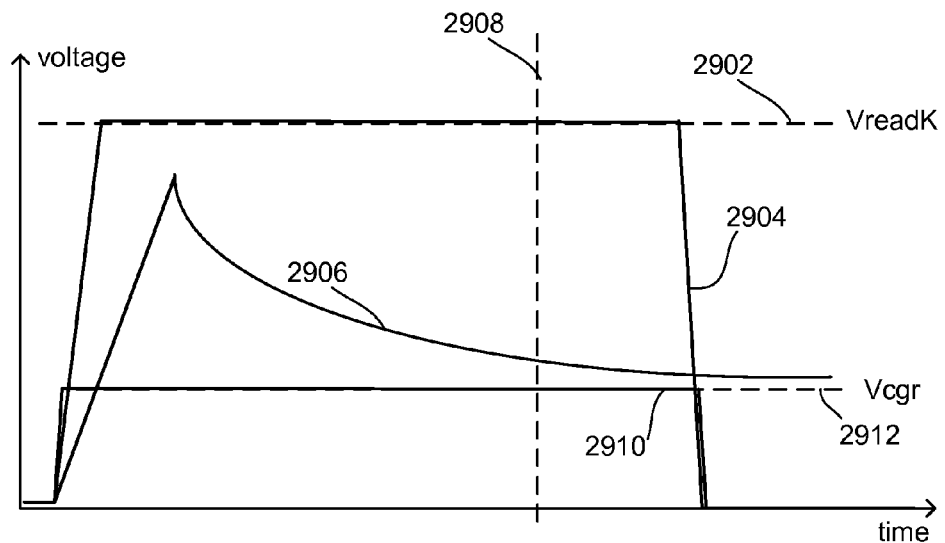
FIGS. 19A and 19B are graphs showing the problems arising from attempting to read memory cells in a block with one or more broken word lines using a normal read operation.

FIG. 19A depicts the problem caused by attempting to read the memory cells connected to a broken word line, such as WLn as depicted in FIGS. 16-18. The vertical axis of FIG. 19A represents voltage, and the horizontal axis represents time. Curve 2906 is an exemplary waveform of the voltage on the broken word line during a read operation. The dashed line 2902 marks the ideal VreadK value to which word lines (such as WLn−1 and WLn+1 in FIGS. 16-18) neighboring the word line selected for reading are raised. Curve 2904 is an exemplary waveform of the voltage of the word lines neighboring the word line selected for reading being quickly raised to VreadK, remaining at VreadK for a duration of time, and falling back to their original voltage levels. VreadK is usually about 8-12 volts, which is generally adequate for exceeding the threshold voltage of the memory cells connected to the word lines neighboring a word line selected for reading without changing the states of the memory cells.

Dashed line 2912 marks the ideal voltage for Vcgr (e.g., Vra., Vrb or Vrc) to which the word line selected for reading is raised for sensing memory cells connected to this word line. Curve 2910 is an exemplary waveform of the voltage of word line WLn if it was not broken, being quickly raised to Vcgr, remaining at Vcgr for a duration of time, and falling back to the previous voltage level at which the word line was being held. Vcgr is usually between 0-5V.

The increased resistance in the broken word line, as depicted in FIG. 18, causes the voltage on the word line, as shown by curve 2906, to deviate significantly from the ideal curve 2910. The increased resistance from the broken word line causes at least part of the word line to be significantly electrically isolated from circuitry such as word line decoder 2716. As a result, the voltage on the broken word line is far more affected by capacitive coupling from neighboring word lines than is the voltage of an unbroken word line. During the rising edge of curve 2904, during which the neighboring word lines are being driven to VreadK, curve 2906 closely follows curve 2904, as the impedance between capacitively coupled lines is particularly low during transient events. However, once curve 2904 has reached a relatively steady state at VreadK, curve 2906, which peaks near VreadK, slowly drops off, showing how the broken word line slowly discharges through its high resistance down toward Vcgr, to which the word line is being driven.

Dashed line 2908 marks the time at which the system begins sensing memory cells connected to the broken word line. At this time, curve 2906 is still significantly higher than Vcgr, which can cause an error during the sensing operation.

Figure 19B:
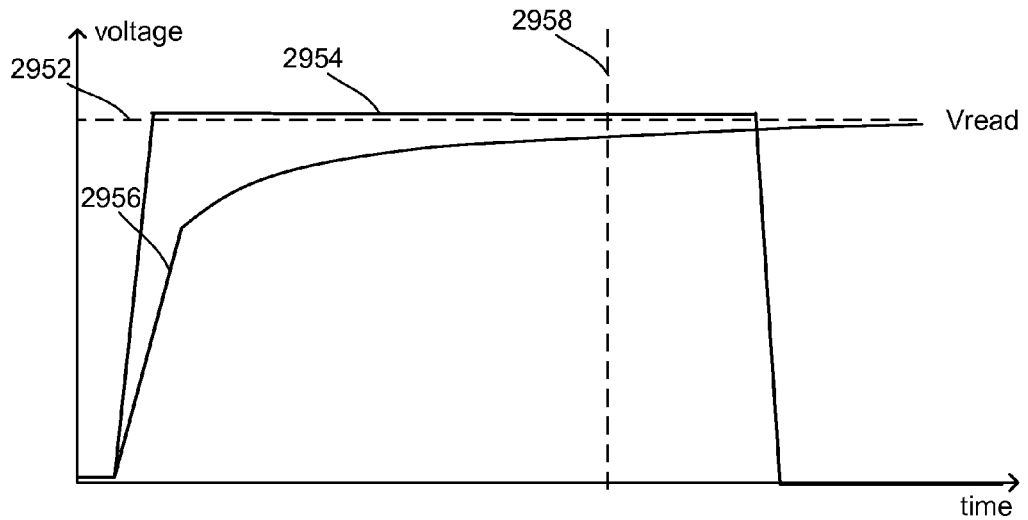

Suppose the system is in step 1420 of the process depicted in FIG. 15, wherein the system is trying to drive the broken word line to Vra. In other words, Vcgr=Vra in this scenario. Suppose that a memory cell that is connected to the broken word line stores state B. If the word line were not broken, then as curve 2910 indicates, the word line would be successfully driven to Vcgr (Vra) which the system would correctly sense at the time marked by dashed line 2908. However, since the word line is broken in this scenario, according to curve 2906, the voltage at the broken word line is significantly higher than Vra at the time marked by dashed line 2908. FIG. 19B depicts the problem caused by attempting to read the memory cells connected to an unbroken word line in the same block (such as block 2700 in FIGS. 16-18) as a broken word line. As in FIG. 19A, the vertical axis of FIG. 19B represents voltage, and the horizontal axis represents time. Even if the memory cells connected to a broken word line are not being read during a particular read operation, the broken word line can still affect read operations of other memory cells, since the memory cells connected to all word lines not being read must still act as pass gates. Curve 2956 is an exemplary waveform of the voltage on the broken word line during a read operation on a word line other than the broken word line. The dashed line 2952 marks the ideal voltage to which word lines other than the word line selected for reading are raised, which is denoted Vread. Curve 2954 is an exemplary waveform of voltage of the word lines other than the word line selected for reading being quickly raised to Vread, remaining at Vread for a duration of time, and falling back to their original voltage levels. Vread is usually about 7 to 10V. If not for the word line being broken, curve 2956 should be the same as curve 2954. Though the broken word line is being driven to Vread, the delay caused by the increased resistance from the break in the word line is the reason curve 2956 rises slowly (slower than 2954) and fails to properly follow curve 2954. The dashed line 2958 marks a time at which the system normally begins to sense memory cells connected to a word line the same block as the broken word line. Since curve 2956 has failed to rise to Vread by this time, the memory cells connected to the broken word line may not act as pass gates, preventing the bit lines in the block from conducting.

The disclosed technology includes methods to address the problems presented by broken word lines for reading memory cells in the same block as the broken word lines. The methods, which for example may be executed by controller 144 or at the firmware level of a memory system including the memory technology described, change parameters such as the time when sensing of a word line begins and/or the voltage driven on word lines neighboring the broken word lines. However, before the system changes these parameters, the system must first detect whether one or more word lines in a given block are broken. In order to detect a broken word line during normal operation of the memory, the system can monitor the time-out of programming operations on word lines in a given block. The system can monitor the time-out for programming, for example, by a loop counter or by counting the number of clock cycles that have elapsed during the programming operation. If the programming of a certain word line times out improperly, this may indicate that at least some of the memory cells connected to this word line are not being adequately charged, and are therefore not being programmed properly. As has been explained above, this inability of memory cells connected to a word line to receive appropriate charge can result from the fact that the word line is broken.

Figure 20A:
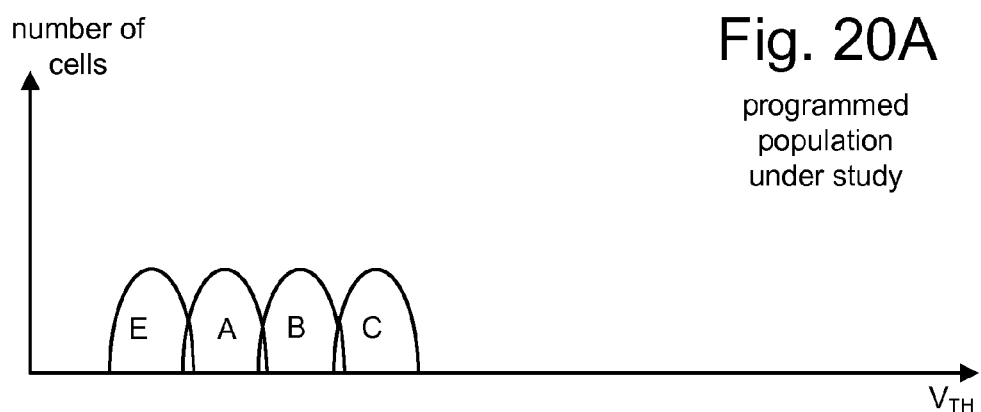
FIGS. 20A and 20B depict exemplary threshold voltage distributions for memory cells connected to a broken word line.
Figure 20B:
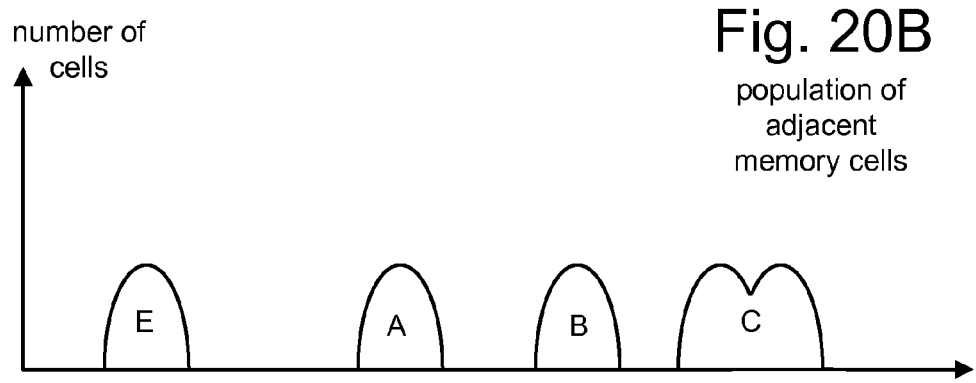

The system can also, in many cases, obtain the threshold voltage distribution, such as that depicted in FIG. 11, of memory cells connected to a word line. To obtain the threshold voltages of memory cells in a word line, the system can perform sensing operations on the word line (as in FIG. 15) at various values of Vra, Vrb, and Vrc. While the distribution depicted in FIG. 11 would reflect that the word line in question has no serious defects, certain other threshold voltage distributions likely indicate that a word line is broken. FIGS. 20A and 20B are examples of such distributions. It is important to note that FIGS. 20A and 20B are only illustrative, and threshold voltage distributions that indicate a broken word line need not resemble FIGS. 20A and 20B. For instance, FIG. 17 indicates that the location of the break in the word line can vary. The change in resistance in a word line that is broken, which is shown in FIG. 18, can vary depending on the severity of the break. These factors, among others, can influence the nature of the threshold voltage distribution of memory cells connected to a broken word line.

FIG. 20A depicts an exemplary distribution of threshold voltages of memory cells on a broken word line. FIG. 20A is a modification of the distribution depicted in FIG. 11 as a result of the issue depicted in FIG. 19A. While the graph in FIG. 20A applies to memory cells that store two bits of data, the phenomenon described can be extrapolated to memory cells that store any number of bits. In FIG. 19A, the threshold voltage distributions of states E-C are closer together than in FIG. 11 and even overlap, which presents a clear problem for correctly reading data states from memory cells connected to a broken word line. The distributions are closer together because the distributions for states A-C have been down-shifted. The reason for this downshift is that, as shown in FIG. 19A, even when the broken word line is being driven at Vread values lower than the actual threshold voltages of the memory cells connected to the broken word line and storing a given data state, the coupling from the neighboring word lines at VreadK often raises the voltage broken word line above the threshold voltages of these memory cells. Thus, the system detects that memory cells connected to the broken word line conduct even when the Vread to which the memory cell is driven is nominally low. While the system may sometimes read the memory cells correctly, there is likely to be a significant number of errors, as shown by the number of memory cells in the overlapping regions of the threshold voltage distributions of the data states.

Figure 23:
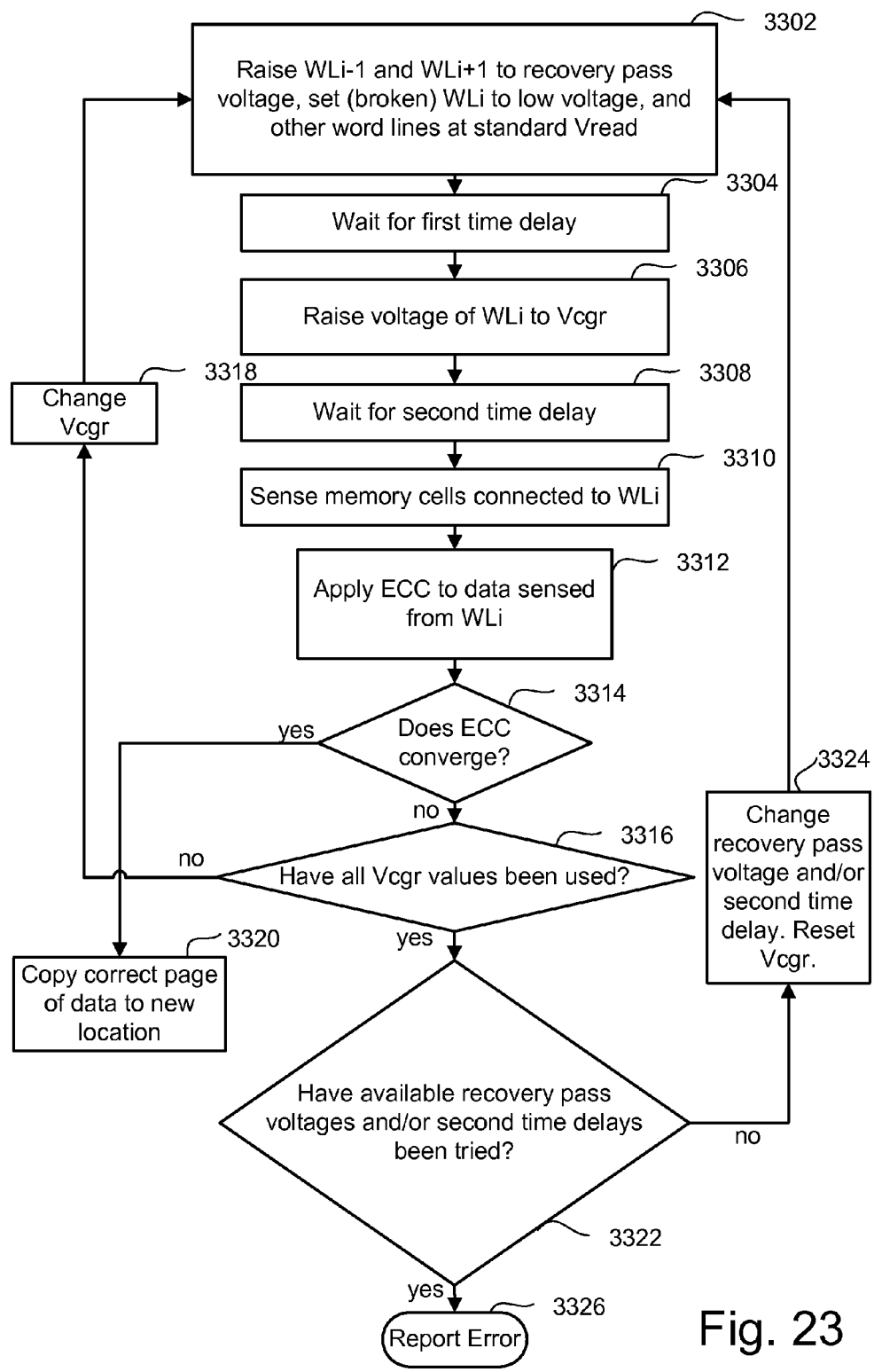
FIG. 23 is a flow chart describing one embodiment of a process for reading data from a broken word line

FIG. 20B depicts another possible distribution of threshold voltages of memory cells connected to a broken word line. In the case depicted in FIG. 20B, the break in the word line is not as severe as in the case depicted in FIG. 20A. Thus, the distributions for states E, A, and B are largely unchanged from FIG. 11. However, for state C, the threshold voltage distribution is bimodal. The reason for this unusual distribution can be seen in FIG. 16, wherein the only broken word line is WLN in area 2612. Suppose that the circuit driving WLn to Vcgr is to the left of the memory array. Then the control gates of the memory cells on WLn to the left of the break in area 2612, that is, the memory cells on WLn connected to bit lines BL0-BLm−1, charge up normally and are successfully driven to all Vcgr values, including Vrc. However, the increased resistance due to the break in the word line, as shown in FIG. 23, means that memory cells connected to WLn to the right of the break, that is, between BLm and BLMax, are likely to receive a lower voltage on their control gates as the system is (nominally) driving WLn to Vcgr. For states A and B, this effect may not matter significantly since Vcgr is not generally not high for these states in the first place, and capacitive coupling from word lines such as WLn−1 and WLn+1 might help drive up the voltage on WLn, as shown in FIG. 19A. For this reason, the threshold voltage distributions have not changed significantly. However, the Vcgr for state C (Vrc) may be so high that, in the case depicted in FIG. 20B, the resistance caused by the break in WLn prevents the control gates of memory cells connected to WLn and to the right of BLm−1 from charging up past the threshold voltage, such that even capacitive coupling from nearby word lines fails to WLn to the right of BLm−1 from exceeding the threshold voltage of memory cells in state C. Therefore, the left mode of the threshold voltage distribution of memory cells in state C approximately reflects the number of memory cells in state C to the left of the break in WLn, and thus were able to charge up properly when a normal Vrc value was applied, whereas the right mode of the threshold voltage distribution of memory cells in state C approximately reflects the number of memory cells in state C to the right of the break in WLn, and therefore had to be driven to a higher voltage to exceed their threshold voltages.

Figure 21:
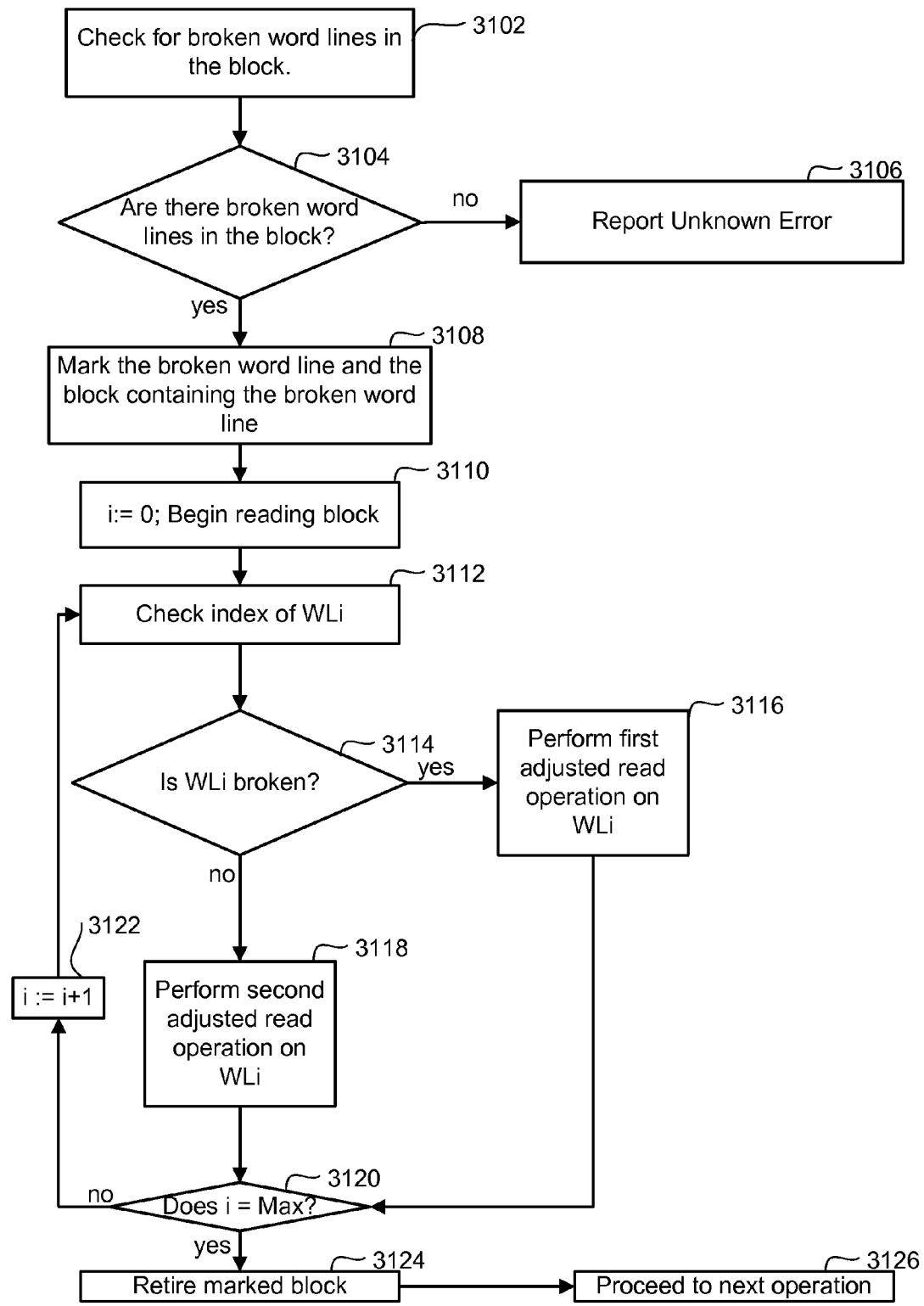
FIG. 21 is a flow chart describing one embodiment of a process for reading a block with one or more broken word lines.

FIG. 21 is a flow chart depicting a process for reading word lines in a block with a broken word line. The process of FIG. 21 can be used as one embodiment of step 1414 of FIG. 14. In some embodiments, the process depicted in FIG. 21 is controlled by controller 144 or one or more other managing circuits. Prior to determining whether a particular word line in the block is broken, the system can perform standard read operations on the word lines in the block, applying the standard Vcgr, Vread, and VreadK voltages on the appropriate word lines and sensing the bit lines in the block as described above. In step 3102, the system determines whether the block has a broken word line via analyzing threshold voltage distributions of the memory cells connected to the word lines in the blocks based on the read operations performed on these word lines, as described above for FIGS. 20A and 20B. Alternatively, the system can check for a broken word line by monitoring cycle count or other test. In another embodiment, step 3102 only includes determining whether the current word line being read is broken.

If the system has concluded that there are no broken word lines in the block (step 3104), then in step 3106, the system reports an unknown error to the host. If the system has concluded that there are one or more broken word lines in the block (step 3104), then the system marks the block and the broken word lines within the block in step 3108. In some embodiments, the system maps a flag bit to the block and to each broken word line according to an index i of the word line, wherein the word line indexed by 0 (WL0) is the closest word line to SGS on the source side of the block, as shown in FIGS. 1-18, and each word line indexed by i+1 (WLi+1) is one word line further from the source side and closer to the drain side than the word line indexed by i (WLi).

Because the block has one or more broken word lines, the data for the block needs to be recovered and moved to a block of memory cells that does not have defects. In step 3110, the system begins a process of reading the word lines in the marked block. In one embodiment, the system sets the index i of the word line to be read to 0. From step 3110, the system performs step 3112, in which the system determines whether the index of the word line to be read (WLi) matches the index of one of the broken word lines, as marked in step 3108. In step 3114, the system decides how to proceed based on whether or not WLi is broken. If WLi is broken, then in step 3116, the system performs a first kind of adjusted read operation on WLi. More detail for this adjusted read operation is provided in FIG. 23. If WLi is not broken, then in step 3118, the system performs a second kind of adjusted read operation on WLi. More detail for this kind of adjusted read operation is provided in FIG. 22.

After performing step 3116 or 3118 for WLi, the system determines whether i=Max, which means that WLi is the word line closest to SGD and the drain side of the block. If WLi is not the word line closest to SGD, then in step 3122, the system increments i by one or performs an equivalent operation before returning to step 3112. If WLi is the word line closest to SGD, then the system has finished reading the block and retires the marked block in step 3124 from further use. In this embodiment, once the system has discovered one or more broken word lines in a block, the system only reads through the block in order to recover the data for safekeeping in another location, but afterwards abandons the defective block. In other embodiments, the system does not retire the marked block in step 3124 but instead designates the block for specialized use. In one embodiment, this specialized use consists of erasing the block as before (in response to a request from the host to perform an erase operation), but when performing program or read operations, skipping the broken word lines, and, when performing read operations on word lines in the block that are not broken, performing the second adjusted read operation described in step 3118 so that the memory cells connected to the broken word lines can still act as pass gates. In another embodiment of specialized use, the system can continue to read, program, and erase the marked block (in response to requests from the host to perform read operations, program operations, and erase operations, respectively), but adjust the read operations according to steps 3116 and 3118 in order to correctly read the word lines in the block. After step 3124, the system proceeds to the next operation in step 3126.

Figure 22:
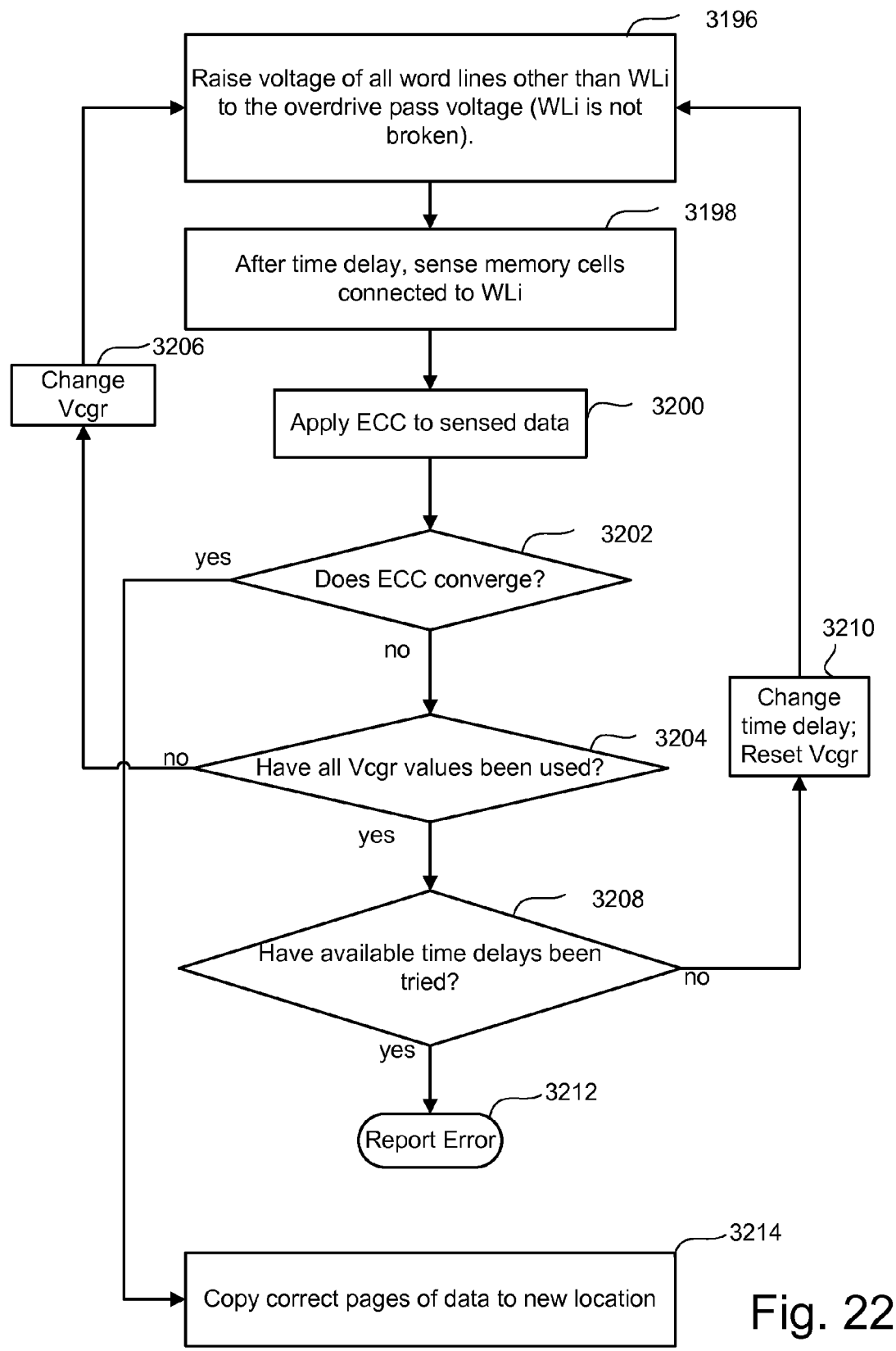
FIG. 22 is a flow chart describing one embodiment of a process for reading data from an unbroken word line in a block with one or more broken word lines.

FIG. 22 is a flow chart depicting a process for reading regular word lines (that is, word lines other than the broken word line in the block). FIG. 22 provides more detail regarding step 3118 of FIG. 21 (the second adjusted read operation). In step 3196, the system raises the voltage on all the word lines other than WLi, the word line being read, to a high voltage. Normally, when reading word line WLi, (assuming no broken word line) non-selected word lines are at Vread and neighbor word lines are at VreadK. Vread is a voltage that is high enough to turn on all of the memory cells of a NAND string not being read (regardless of the data they are storing)

so they act as pass gates. In some embodiments, Vread can be in a range of 7-10 volts. Step 3196 includes applying a voltage (hereinafter noted as the overdrive pass voltage that is 1-3 volts higher than Vread. In some embodiments, the system does not raise the voltage on all word lines other than WLi to the overdrive pass voltage, but only on the broken word line and one or both of word lines neighboring the broken word lines raising the other word lines not currently being read to standard Vread values. In some embodiments, the system raises only the broken word lines and subsets of word lines near the broken word lines to the overdrive pass voltage, while raising other word lines not currently being read to standard Vread values.

In some embodiments during a read process with a broken word line, unselected word lines receive Vread, except for word lines that are neighbors (i.e. adjacent) to the word line selected for programming. The neighbor word lines receive VreadK, which is 1-2 volts higher than Vread. The overdrive pass voltage should be 1-2 volts higher than VreadK. In some embodiments, if the broken word line is adjacent to WLi, the broken word line is driven to VreadK, and the other neighbor of the broken word line is raised to the overdrive pass voltage or slightly higher, if possible.

In step 3198, the system waits for a certain time delay such as that marked by dashed line 2958 of FIG. 19B prior to sensing the bit lines in the block. This time delay allows the voltage on the broken word line to increase towards the overdrive pass voltage coupled from the neighbor word lines, and, therefore, to at least Vread. For example, to determine which memory cells connected to WLi are at state E as depicted in FIGS. 10-12, the system can perform steps 1420-1424 of FIG. 15, wherein the Vcgr applied to WLi is Vra. In step 3200, the system applies ECC to the data sensed from WLi in the latest and previous iterations of step 3198. In step 3202, the system decides how to proceed based on whether or not the ECC applied in step 3200 converges to a solution (meaning that the data stored is successfully identified using the ECC). If the ECC does converge, then in step 3214, the system transfers the corrected pages of data sensed from WLi to a new location such as a new block. If the ECC does not converge, then in step 3204, the system checks whether all Vcgr voltages that are appropriate for the data being sensed have been used. Depending on which bits or pages of data are being read, more than one sense operation may be needed. As mentioned before, the memory cells sensed using the disclosed technology may store one bit of data, two bits of data, or more. If not all appropriate Vcgr values have been used, then in step 3206, the system changes the Vcgr to be used in a next iteration of step 3198 (i.e. Vra to Vrb, Vrb to Vrc) before returning to step 3196. If all appropriate Vcgr values have been used but ECC does not converge, the system proceeds to step 3208, by which point the system has read the memory cells connected to WLi.

In step 3208, the system checks whether the available time delays have been tried. In some embodiments, the set of available time delays is predetermined for controller 144. In some embodiments, the set of available time delays is dynamically determined by controller 144 based on inputs such as commands from the host. If the system has not tried all available time delays, then in step 3210, the system will adjust the recovery process and try again. In one embodiment, the system changes the time delay for beginning sensing before returning to step 3196 and reading the memory cells connected to WLi again with the new time delay. For example, the default time delay can be 100 microseconds. If ECC does not converge using this time delay, then for a second iteration, the system can change this time delay to 1 millisecond in step 3210, followed by 10 milliseconds for a third iteration, 100 milliseconds for a fourth iteration, and so on. Other values of time delays can be used. If, for example, the system has just performed a sensing operation with Vcgr at Vrc, the system will also reset Vcgr to Vra in step 3210 in order to repeat a full read operation on WLi.

If the system has attempted to read WLi at all available time delays and the ECC applied to the data sensed from WLi does not converge, then the break in the broken word line is likely so severe that the voltage on the broken word line cannot be raised up to or past Vread in a time reasonable for the application of non-volatile memory system, and, consequently, the data from WLi is not recovered. Thus, in step 3212, the system reports an error to the host. The host can decide how the system will respond to the error. As mentioned above, the system can in some cases continue to use the block with broken word lines in the future as before instead of retiring the block from further use. In some embodiments, the system can erase the block as before but skip the broken word lines for read and program operations, performing the second adjusted read operation on word lines other than the broken word lines. In some embodiments, the system can adjust the read operations on the word lines of the block as dictated by the processes of FIGS. 21-23. In some embodiments, the system can decide to retire the block in step 3124 of FIG. 21 if the system must report an error in step 3212 of FIG. 22. In some embodiments, if ECC does converge at step 3202, the system records the magnitude of the time delay used in the last iteration of step 3198. This way, if the system reads the block with the broken word line in the future, the system can use this recorded magnitude of the time delay in future iterations of the process of FIG. 22, thereby saving time during the read operation.

As an example to show how the process of FIG. 22 may be used, suppose the system is reading WLi. While WLi is not broken, another word line in the same block as WLi is broken. The system raises the voltages on all word lines except WLi to the overdrive pass voltage in these word lines (step 3196). The system attempts to read WLi, applying the various Vcgr voltages such as described in FIG. 14 to determine whether the memory cells connected to WLi conduct. A time delay of 100 microseconds is allowed before WLi is sensed (step 3198). Suppose, when ECC is applied to the information sensed from WLi, ECC does not converge (step 3202). This indicates that 100 microseconds is likely not enough for the broken word line to be charged up to Vread. If the system has flexibility regarding the time delay allowed before sensing memory cells connected to WLi (step 3208), the system adjusts the delay from 100 microseconds to 1 millisecond. Suppose, after the system repeats steps 3196 through 3202, but allowing 1 millisecond to pass before sensing the memory cells connected to WLi, ECC still does not converge. Depending on the system configuration, the system may decide in step 3208 that a time delay greater than 1 millisecond before sensing memory cells is not acceptable, and reports an error (step 3212). Alternatively, the system may adjust the time delay to 10 milliseconds in step 3210 before returning to step 3196. The time delay can be changed to and from different amounts, by different increments, and over a different number of iterations. The values mentioned here are purely for the purpose of illustration and should not be construed as limiting the scope of the disclosed technology.

FIG. 23 is a flow chart depicting a process for reading data from memory cells connected to a broken word line. FIG. 23 provides more detail regarding step 3116 (the first adjusted read operation) of FIG. 21, at which point the system is to read the memory cells connected to WLi, the broken word line. In step 3302, the system raises one or both of the word lines neighboring WLi that is, WLi−1 and WLi+1, to a recovery pass voltage, which is slightly lower (e.g., 1-2 volts lower) than the standard VreadK (standard neighbor pass voltage) normally applied to the neighbor word lines when WLi is not broken. However, the system can raise WLi−1 and WLi+1 to other voltages as well, but the voltage to which these word lines are raised should at least exceed the threshold voltages of the memory cells connected to these word lines. In some embodiments, the system raises the voltages of WLi−1 to one level and concurrently raising the voltage on WLi+1 to a different level, while in other embodiments they are raised to the same level. Furthermore, the system keeps the voltage at word line WLi at a low voltage (e.g., at or near 0V), and raises the voltages of the word lines other than WLi−1 through WLi+1 to a standard Vread. However, in some embodiments, the system raises the word lines other than WLi−1 and WLi+1 to a voltage lower than the standard Vread, such as the recovery pass voltage. The recovery pass voltage on the one or both of WLi−1 and WLi+1 capacitively couples to word line WLi, causing the voltage on WLi to approach the recovery pass voltage. Because 0V (or another low voltage) is driven on WLi, the voltage on WLi will subsequently dissipate toward Vcgr. Since the neighboring word lines are at the recovery pass voltage, which is lower than Vread or VreadK, then the selected word line will dissipate to Vcgr quicker than if the neighboring word lines are at VreadK.

In step 3304, the system waits for a first time delay in order to allow WLi to decrease towards the low voltage (which effectively causes the voltage on WLi to decrease towards Vcgr). In step 3306, the system biases the broken word line to a Vcgr value as described in FIG. 14. In step 3308, the system waits for a second time delay to allow the broken word line to settle at or near Vcgr. This second time delay is longer than it would be if WLi were not broken. Driving WLi to Vcgr should help the voltage of WLi settle at Vcgr faster and more accurately. In step 3310, after the second time delay which is subsequent to the first time delay, the system senses the memory cells connected to broken word line by sensing the bit lines connected to the memory cells, thereby detecting whether the voltage on WLi exceeds the threshold voltage of the memory cells connected to WLi. In step 3312, the system applies ECC to data obtained from the word line through the sensing of memory cells in the latest and previous iterations of step 3310. In step 3314, the system checks whether the ECC applied to the obtained data converges to a solution. If the ECC converges on a solution (meaning that the data stored is successfully identified using the ECC), then in step 3320 the system copies the data to a new location, such as a second block different from the current block.

If the ECC does not converge (meaning that the data stored is not successfully identified using the ECC) at step 3314, then in step 3316, the system determines whether all necessary Vcgr voltages have been applied for data being sensed. Depending on which bits or pages of data are being read, more than one sense operation may be needed. For example, if the memory cells in the block store two bits of data, and the system applied Vra in step 3306, then the system has yet to apply Vrb and Vrc. Thus, if the system has not yet used all Vcgr values necessary for reading the appropriate data, then in step 3318 the system changes the Vcgr to be applied (i.e. Vra to Vrb, Vrb to Vrc), before returning to step 3302.

If the system has already applied the Vcgr voltages appropriate for the memory cells being sensed but the ECC applied in step 3312 did not converge then the increased resistance in the broken word line may have prevented the voltage on the broken word line from settling to the proper Vcgr values. In some embodiments, the system can repeat the read operation on the broken word line in order to allow the broken word line to settle to the proper Vcgr value so that the ECC does converge. However, when the system repeats the read operation, the system can change the recovery pass voltage to which the word lines neighboring the broken word line are biased in step 3302. By changing the recovery pass voltage on the word lines neighboring the broken word line, the system can exploit the capacitive coupling depicted in FIG. 18 to influence the voltage on the broken word line. Specifically, by lowering the recovery pass voltage, the system decreases the degree to which the voltage on WLi overshoots Vcgr, making it more likely that the voltage on WLi will be sufficiently close to Vcgr at some point between the first time delay and the subsequent second time delay. When repeating the read operation on the broken word line, instead of or in addition to changing the recovery pass voltage of the word lines neighboring the broken word line, the system can also change the second time delay during which the system waits for the voltage on WLi to settle to the appropriate Vcgr value in step 3308. More detail regarding the efficacy of these changes for a read operation is described in FIG. 24A. Thus, if the ECC does not converge at step 3314 and all appropriate Vcgr values have been used at step 3316, the system proceeds to step 3322. In some embodiments, if ECC does converge at step 3314, the system records the magnitude of the recovery pass voltages applied to WLi−1 and WLi+1 in the last iteration of step 3302 and the magnitude of the second time delay used in the last iteration of step 3308. This way, if the system reads the block with the broken word line in the future, the system can use these recorded values in future iterations of the process of FIG. 23, thereby saving time during the read operation.

In step 3322, the system checks whether all available recovery pass voltage values to which the WLi−1 and WLi+1 can be raised in step 3302 and/or whether all available second time delays for which the system can wait in step 3308 have been tried. In some embodiments, the sets of available second time delays and recovery pass voltage values are predetermined for or by Controller 144. In some embodiments, the sets of available second time delays and recovery pass voltage values are dynamically determined by Controller 144 based on inputs such as commands from the host. If all available recovery pass voltage values and second time delays as described above have been tried and ECC has still not converged, the system reports an error to the host in step 3326 in order to avoid attempting to read the broken word line indefinitely. The host can decide how the system will respond to the error.

If the system has not tried all available recovery pass voltage values and second time delays as described above, the system changes one or both of these values in step 3324 before returning to step 3302 and repeating the process of FIG. 23. The system can employ various strategies to change the recovery pass voltage of the word lines neighboring the broken word line or second time delays in order to increase the chance of reading the broken word line without error. For instance, the system may only vary the second time delay and keep the recovery pass voltage constant. Suppose that by default, the system uses a second time delay of 10 microseconds and a recovery pass voltage of 6V. If 10 microseconds is not adequate to allow the voltage on WLi to settle to the appropriate Vcgr value, and this fact is reflected in the failure of ECC to converge to a solution, then in one example implementation of step 3324, the system can set the second time delay to 100 microseconds for a second iteration of steps 3302 through 3314. In a similar manner, if 100 microseconds is an inadequate second time delay, the system can change the magnitude of the second time delay to 1 millisecond for a third iteration of steps 3302 through 3314. If necessary, the system can raise the second time delay to 10 milliseconds for a fourth iteration of steps 3302 through 3314. Other second time delays and numbers of iterations can be used.

In another embodiment, the system can keep the second time delay constant and vary the recovery pass voltage. By way of example only, if the initial recovery pass voltage for the WLi−1 and WLi+1 is 7V, then the system can lower the recovery pass voltage at each iteration of step 3324 by increments of as small as 25 mV until the recovery pass voltage is 5.5V, or some other voltage above the threshold voltage of the memory cells connected to WLi−1 and WLi+1. In some embodiments, the system can also change Vread on other word lines in the block in order to take advantage of coupling from the series capacitance shown in FIG. 18. The magnitude of the recovery pass voltage can be changed gradually by increments of as small 25 mV in case the data to be recovered from the block is critical and time is a less important consideration. However, the magnitude of the recovery pass voltage can instead be changed in larger increments in order to save time.

In some embodiments, the system can lower the recovery pass voltage of WLi−1 and WLi+1 at each iteration of step 3324 down to a certain magnitude and, keeping the recovery pass voltage at this magnitude, change the second time delay in subsequent iterations of step 3324. In other embodiments, the system can keep the recovery pass voltage constant and raise the second time delay up to a certain magnitude, then, while keeping the second time delay at that magnitude, proceed to change the magnitude of the recovery pass voltage in subsequent iterations of step 3324. The system can also alternate between changing the magnitude of the recovery pass voltage and changing the magnitude of the second time delay in various orders and combinations, as necessary. The system can change the magnitudes of both the recovery pass voltage and the second time delay in the same iteration of step 3324.

Additionally, during step 3324, the system resets the Vcgr at which to drive WLi if the memory cells connected to the WLi store more than one bit of data. That is, if the memory cells connected to broken word line store two bits of data, and the last Vcgr applied to the word line at step 3306 was Vrc, and the system is performing step 3324, the system must ensure that the sequence of Vcgr values applied to WLi begins again at Vra.

Two special cases of broken word lines should be considered. The first special case is if WLi is broken when i=0, meaning that the word line neighboring SGS and closest to the source side of the block is broken. The second special case is if WLi is broken when i=Max, meaning that the word line neighboring SGD and closest to the drain side of the block is broken. These cases are special because, as FIGS. 16-18 show, these broken word lines only have one neighboring word line, rather than two. As such, the system may employ several strategies for addressing these special cases. In some embodiments, the systems may vary the voltage on the nearest select line (SGS or SGD) to take advantage of capacitive coupling between the broken word line and the select line. In other embodiments, the system can raise the voltage on the one neighboring word line differently than would be raised on word lines neighboring other broken word lines in order to compensate for the capacitive coupling reduced by the presence of only one neighboring word line. In other embodiments, the system can change the second time delay differently than would be changed for reading other broken word lines in order to compensate for the capacitive coupling reduced by the presence of only one neighboring word line. In some embodiments, the system can employ the process described above with respect to FIGS. 21-23, but only applying the recovery pass voltage to the one neighbor.

Figure 24A:
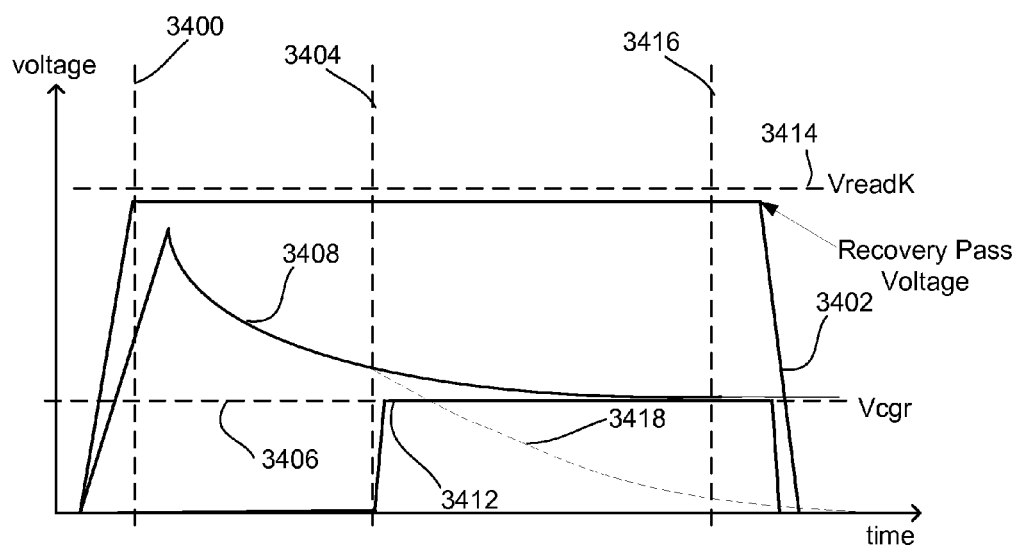
FIGS. 24A and 24B are graphs showing how the processes of FIGS. 22 and 23 address the problems depicted in FIGS. 19A and 19B.

FIG. 24A shows how the broken word line problem depicted in FIG. 19A is solved by the process of FIG. 23. Suppose the broken word line is WLi, as described for FIG. 23. Dashed line 3400 marks the time at which WLi−1 and WLi+1 reach the recovery pass voltage, which is slightly lower than the standard VreadK (marked by dashed line 3014). The waveform of the voltages on WLi−1 and WLi+1 is represented by curve 3402. Concurrently with WLi−1 and WLi+1 (in step 3302 of FIG. 23) being raised to the recovery pass voltage, the word lines other than WLi−1 through WLi+1 are raised to a standard Vread value (not shown). At this time, a low voltage at or near 0V is driven on the selected (and broken) word line WLi. The actual voltage on WLi is represented by curve 3408. As shown in FIG. 24A, curve 3408 follows curve 3402 during the rising edge and overshoots dashed line 3406 (the ideal Vcgr). However, the voltage on the broken WLi does not rise as high as shown in FIG. 19A, since the neighboring word lines to which WLi is coupled are only raised to the recovery pass voltage rather than VreadK. This allows the voltage on WLi to reach Vcgr quicker as it dissipates.

Dashed line 3404 marks the time at which Vcgr (which, as above, depends on the data state being sensed) is driven on WLi in step 3306. The voltage driven on WLi is represented by curve 3412. The interval between the times marked by dashed lines 3400 and 3404 is the first time delay, for which the system waits in step 3304. As mentioned above, one reason for this delay is to allow the voltage on WLi to dissipate toward Vcgr more quickly. As indicated by dashed curve 3418, the voltage on WLi would continue to dissipate towards 0V unless WLi is driven to another voltage. At the time marked by dashed line 3404, curve 3408 is still significantly higher than dashed line 3406 (the ideal Vcgr). If the sensing of the bit lines in the block begins at this time, the error described in FIG. 19A will still likely occur. Depending on the duration of the first time delay, the voltage on WLi may even have dipped below Vcgr at the time marked by dashed line 3404. Regardless, even though WLi is being driven to Vcgr at the time marked by dashed line 3404, the actual voltage on WLi will still take time to settle to Vcgr due to the RC delay caused by the break in WLi. For this reason, the system waits for the second time delay subsequent to the first time delay (step 3308). The end of this second time delay is marked by dashed line 3416. At this time, curve 3408 (WLi voltage) is sufficiently close to (or at) dashed line 3406 (Vcgr) that sensing the memory cells connected to the broken word lines is unlikely to result in an error that ECC (applied in step 3312) cannot correct, thus fixing the error described in FIG. 19A. Note that the second time delay and recovery pass voltage magnitudes necessary for the voltage on WLi to be sufficiently close to Vcgr by the end of the second time delay may be reached after several iterations of step 3324 of FIG. 23.

Figure 24B:
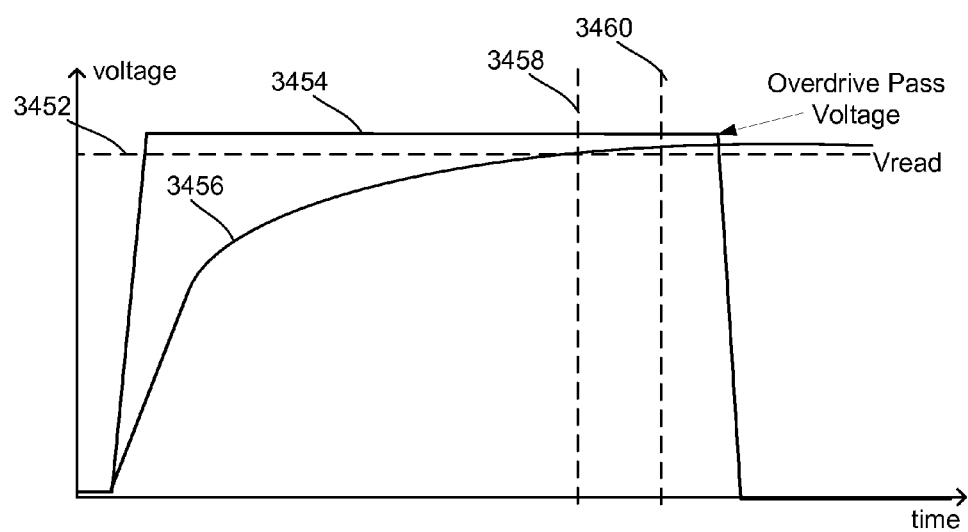

FIG. 24B shows how broken word line the problem depicted in FIG. 19B is solved by increasing the time delay before memory cells connected to an unbroken word line are sensed, as in FIG. 22. In the case described herein, WLi has been selected for reading but is not broken. Curve 3456 represents the voltage on the broken word line. Dashed line 3452 marks Vread, which curve 3456 should preferably reach or exceed in order for the memory cells connected to the broken word line to act as pass gates. Curve 3454 represents the waveform of the voltage to which the word lines other than WLi are being driven. The voltage on these word lines is raised sharply to the overdrive pass voltage (higher than the standard Vread) in step 3196 of FIG. 22. Dashed line 3458 (like dashed line 2958 in FIG. 19B) represents the time at which a sensing operation is normally performed on WLi. At this time, as shown by curve 3456 and dashed line 3452, the voltage on the broken word line, pulled up by capacitive coupling from neighboring word lines at the overdrive pass voltage, has reached Vread. However, depending on the severity of the break in the word line, the broken word line may not always reach Vread by the time marked by dashed line 3458. For this purpose, if ECC does not converge to a solution in step 3202 of FIG. 22, the system may wait for a time delay before performing a sensing operation on WLi, as described for a subsequent iteration of step 3198 of FIG. 22. The end of this time delay is marked by dashed line 3460. At this time, the voltage on the broken word line has exceeded Vread, as shown by curve 3456 crossing dashed line 3452. This means that the memory cells connected to the broken word line will correctly act as pass gates. At this point, sensing of the memory cells connected to WLi (raising WLi to Vcgr and sensing the bit lines in the block) will likely proceed correctly, at least after applying ECC as in step 3200 of FIG. 22. This solves the problem described by FIG. 19B. Note that the time delay necessary for the voltage on the broken word line to reach or exceed Vread may be reached after several iterations of step 3210 of FIG. 22.

Described above is a technology to change the parameters by which a read operation is performed on memory cells in a block with one or more broken word lines. The first method disclosed is for reading a broken word line. One embodiment of the first method disclosed involves changing the voltage on word lines neighboring the broken word line to set the voltage on the broken word line to the appropriate read voltage through capacitive coupling between the word lines. Another embodiment of the first method disclosed involves increasing the time delay before memory cells connected to the broken word line are sensed to allow the voltage on the word line more time to settle due to the increased RC delay caused by the break in the word line. These embodiments can also be combined. The second method disclosed is for reading an unbroken word line in a block with a broken word line. One embodiment of the second method disclosed involves increasing the time delay before memory cells connected to the unbroken word line are sensed while raising the voltages on the other unbroken word lines in the system in order to ensure that the memory cells connected to the broken word lines can act as pass gates. In some embodiments, after read operations, including read operations with the disclosed changes, have been performed on all the memory cells in the block with the broken word lines, the entire block is retired, the data on the block having been moved to another block for safekeeping. In other embodiments, the block with the broken word lines can be marked for specialized use.

One embodiment comprises a method to recover data from non-volatile memory comprising concluding that a particular word line is broken, the particular word line is connected to a set of non-volatile storage elements, applying a low voltage to the particular word line, applying a recovery pass voltage to a first neighbor word line that is adjacent to the particular word line, the recovery pass voltage is lower than a standard neighbor pass voltage normally applied to the first neighbor word line when reading the set of non-volatile storage elements if the particular word line is not broken, the recovery pass voltage on the first neighbor word line will couple to the particular word line and raise a voltage on the particular word line to a level above a read voltage, after a first time delay to allow the voltage on the particular word line to decrease towards the low voltage, applying the read voltage to the particular word line; and after a second time delay that is subsequent to the first time delay and allows for the voltage on the particular word line to decrease towards the read voltage, sensing bit lines connected to the set of non-volatile storage elements, the second time delay is longer than if the particular word line is not broken.

One embodiment comprises a non-volatile storage apparatus comprising a plurality of non-volatile storage elements including a first set of non-volatile storage elements and additional sets of non-volatile storage elements, a plurality of word lines connected to the plurality of non-volatile storage elements, the plurality of word lines includes a particular word line, a first neighbor word line that is adjacent to the particular word line, a second neighbor word line that is adjacent to the particular word line and other word lines, the particular word line is connected to the first set of non-volatile storage elements, a plurality of bit lines in communication with the plurality of non-volatile storage elements, and one or more managing circuits in communication with the plurality of word lines and the plurality of bit lines, if the particular word line is concluded to be broken then the one or more managing circuits apply a low voltage to the particular word line and apply a recovery pass voltage to a first neighbor word line that is adjacent to the particular word line, the recovery pass voltage is lower than a standard neighbor pass voltage normally applied to the first neighbor word line when reading the set of non-volatile storage elements if the particular word line is not broken, the recovery pass voltage on the first neighbor word line will couple to the particular word line and raise a voltage on the particular word line to a level above a read voltage, after a first time delay to allow the voltage on the particular word line to decrease towards the low voltage, the one or more managing circuits apply the read voltage to the particular word line, after a second time delay that is subsequent to the first time delay and allows for the voltage on the particular word line to decrease towards the read voltage, the one or more managing circuits sense bit lines connected to the set of non-volatile storage elements, the second time delay is longer than if the particular word line is not broken.

One embodiment comprises a method for reading a memory block with one or more broken word lines, comprising: for a first memory block, the first memory block comprising a plurality of word lines, identifying one or more broken word lines in the first memory block; performing a first adjusted read operation on each of the one or more broken word lines in the first memory block, the first adjusted read operation comprising: applying a first voltage to one or more word lines not being read, after the applying the first voltage to the one or more word lines not being read, waiting for a first time delay, after the waiting for the first time delay, applying a second voltage to a word line being read, the second voltage is lower than the first voltage, after the applying the second voltage to the word line being read, waiting for a second time delay, after the waiting for the second time delay, sensing data from a collection of nonvolatile storage elements, the collection of nonvolatile storage elements is connected to the word line being read, applying ECC to the data sensed from the collection of nonvolatile storage elements, and if the applying ECC fails to converge to a solution, repeating the first adjusted read operation on the word line being read using a recalculated first voltage and a recalculated second time delay, at least one of the recalculated first voltage and the recalculated second time delay differs respectively from one or more first voltages and one or more second time delays used in one or more previous iterations of the first adjusted read operation performed on the word line being read; and performing a second adjusted read operation on each word line in the first memory block other than the one or more broken word lines in the first memory block, the second adjusted read operation comprising: applying a high voltage to one or more word lines not being read, the word lines not being read are each connected to a set of memory cells, the high voltage exceeds a threshold voltage of the set of memory cells, after the applying the high voltage to the one or more word lines not being read, waiting for a time delay, after the waiting for the time delay, sensing data from a collection of nonvolatile storage elements, the set of nonvolatile storage elements is connected to a word line being read, and applying ECC to the data sensed from the collection of nonvolatile storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method to recover data from non-volatile memory, comprising:
concluding that a particular word line is broken, the particular word line is connected to a set of non-volatile storage elements;
applying a low voltage to the particular word line;
applying a recovery pass voltage to a first neighbor word line that is adjacent to the particular word line, the recovery pass voltage is lower than a standard neighbor pass voltage normally applied to the first neighbor word line when reading the set of non-volatile storage elements if the particular word line is not broken, the recovery pass voltage on the first neighbor word line will couple to the particular word line and raise a voltage on the particular word line to a level above a read voltage;
after a first time delay to allow the voltage on the particular word line to decrease towards the low voltage, applying the read voltage to the particular word line; and
after a second time delay that is subsequent to the first time delay and allows for the voltage on the particular word line to decrease towards the read voltage, sensing bit lines connected to the set of non-volatile storage elements, the second time delay is longer than if the particular word line is not broken.

2. The method of claim 1, further comprising:
prior to determining that the particular word line is broken, applying the read voltage to a regular word line that is connected to a group of non-volatile storage elements, the regular word line is not broken, the regular word line is different than the particular word line;
applying the standard neighbor pass voltage to a neighbor word line adjacent to the regular word line; and
in response to the applying the read voltage to the regular word line, sensing one or more bit lines connected to the group of non-volatile storage elements after the first period of time following the applying of the read voltage to the regular word line.

3. The method of claim 1, further comprising:
concurrently with applying the recovery pass voltage to the first neighbor word line, applying a voltage to a second neighbor word line that is lower than the standard neighbor pass voltage in order to couple to the particular word line and raise the voltage on the particular word line, the second neighbor word line is adjacent to the particular word line.

4. The method of claim 3, wherein:
the voltage to the second neighbor word line is the recovery pass voltage.

5. The method of claim 1, further comprising:
applying the read voltage to a regular word line that is connected to a group of non-volatile storage elements, the regular word line is not broken, the regular word line is different than the particular word line;
applying an overdrive pass voltage to the broken word line and the first neighbor word line, the overdrive pass voltage is higher than the standard pass voltage normally applied to the first neighbor word line when reading the group of non-volatile storage elements if the particular word line is not broken; and
in response to the applying the read voltage to the regular word line, sensing the bit lines which are connected to the group of non-volatile storage elements.

6. The method of claim 5, further comprising:
prior to the sensing the bit lines, waiting for a time delay to allow the voltage on the broken word line to increase towards the overdrive pass voltage.

7. The method of claim 1, further comprising:
applying ECC to information sensed from the bit lines; and
if the applying of the ECC does not result in identifying correct data, then changing the second time delay to a different magnitude and repeating the applying a low voltage to the particular word line, applying the recovery pass voltage to the first neighbor word line, applying the read voltage to the particular word line and sensing the bit lines after the second time delay.

8. The method of claim 1, further comprising:
applying ECC to information sensed from the bit lines; and
if the applying of the ECC does not result in identifying correct data, then changing the recovery pass voltage to a different magnitude and repeating the applying a low voltage to the particular word line, applying the recovery pass voltage to the first neighbor word line, applying the read voltage to the particular word line and sensing the bit lines after the second time delay.

9. The method of claim 1, further comprising:
applying ECC to information sensed from the bit lines; and
if the applying of the ECC does not result in identifying correct data, then:
changing at least one of the second time delay and the recovery pass voltage to a different magnitude, and
repeating the applying a low voltage to the particular word line, applying the recovery pass voltage to the first neighbor word line, applying the read voltage to the particular word line and sensing the bit lines after the second time delay.

10. The method of claim 1, further comprising:
applying ECC to information sensed from the bit lines; and
if the applying of the ECC does not result in identifying correct data, then:
changing the second time delay to a different magnitude and changing the recovery pass voltage to a different magnitude, and
repeating the applying a low voltage to the particular word line, applying the recovery pass voltage to the first neighbor word line, applying the read voltage to the particular word line and sensing the bit lines after the second time delay.

11. The method of claim 1, wherein:
the low voltage is at or near 0 volts; and
the second time delay allows the voltage on the particular word line to decrease to the read voltage, the sensing is performed to determine whether the set of non-volatile storage elements have threshold voltages greater than the read voltage.

12. A non-volatile storage apparatus, comprising:
a plurality of non-volatile storage elements including a first set of non-volatile storage elements and additional sets of non-volatile storage elements;
a plurality of word lines connected to the plurality of non-volatile storage elements, the plurality of word lines includes a particular word line, a first neighbor word line that is adjacent to the particular word line, a second neighbor word line that is adjacent to the particular word line and other word lines, the particular word line is connected to the first set of non-volatile storage elements;
a plurality of bit lines in communication with the plurality of non-volatile storage elements; and
one or more managing circuits in communication with the plurality of word lines and the plurality of bit lines, if the particular word line is concluded to be broken then the one or more managing circuits apply a low voltage to the particular word line and apply a recovery pass voltage to a first neighbor word line that is adjacent to the particular word line, the recovery pass voltage is lower than a standard neighbor pass voltage normally applied to the first neighbor word line when reading the set of non-volatile storage elements if the particular word line is not broken, the recovery pass voltage on the first neighbor word line will couple to the particular word line and raise a voltage on the particular word line to a level above a read voltage, after a first time delay to allow the voltage on the particular word line to decrease towards the low voltage, the one or more managing circuits apply the read voltage to the particular word line, after a second time delay that is subsequent to the first time delay and allows for the voltage on the particular word line to decrease towards the read voltage, the one or more managing circuits sense bit lines connected to the set of non-volatile storage elements, the second time delay is longer than if the particular word line is not broken.

13. The non-volatile storage apparatus of claim 12, wherein:
concurrently with applying the recovery pass voltage to the first neighbor word line, the one or more managing circuits apply a voltage to a second neighbor word line that is lower than the standard neighbor pass voltage in order to couple to the particular word line and raise the voltage on the particular word line, the second neighbor word line is adjacent to the particular word line.

14. The non-volatile storage apparatus of claim 12, wherein:
the one or more managing circuits apply the read voltage to a regular word line that is connected to a group of non-volatile storage elements, the regular word line is not broken, the regular word line is different than the particular word line; and
the one or more managing circuits apply an overdrive pass voltage to the broken word line and the first neighbor word line, the overdrive pass voltage is higher than the standard neighbor pass voltage normally applied to the first neighbor word line when reading the group of non-volatile storage elements if the particular word line is not broken; and
in response to the applying the read voltage to the regular word line, the one or more managing circuits sense the bit lines which are connected to the group of non-volatile storage elements.

15. The non-volatile storage apparatus of claim 12, wherein:
the one or more managing circuits apply ECC to information sensed from the bit lines; and
if the applying of the ECC does not result in identifying correct data, then:
the one or more managing circuits change at least one of the second time delay and the recovery pass voltage to a different magnitude, and
the one or more managing circuits repeat the applying a low voltage to the particular word line, applying the recovery pass voltage to the first neighbor word line, applying the read voltage to the particular word line and sensing the bit lines after the second time delay.

16. A method for reading a memory block with one or more broken word lines, comprising:
identifying one or more broken word lines in a first memory block;
performing a first adjusted read operation on each of the one or more broken word lines in the first memory block, the first adjusted read operation comprising:
applying a first voltage to one or more word lines not being read,
after the applying the first voltage to the one or more word lines not being read, waiting for a first time delay,
after the waiting for the first time delay, applying a second voltage to a word line being read, the second voltage is lower than the first voltage,
after the applying the second voltage to the word line being read, waiting for a second time delay,
after the waiting for the second time delay, sensing data from a collection of nonvolatile storage elements, the collection of nonvolatile storage elements is connected to the word line being read,
applying ECC to the data sensed from the collection of nonvolatile storage elements, and
if the applying ECC fails to converge to a solution, repeating the first adjusted read operation on the word line being read using a recalculated first voltage and a recalculated second time delay, at least one of the recalculated first voltage and the recalculated second time delay differs respectively from one or more first voltages and one or more second time delays used in one or more previous iterations of the first adjusted read operation performed on the word line being read; and
performing a second adjusted read operation on each word line in the first memory block other than the one or more broken word lines in the first memory block, the second adjusted read operation comprising:
applying a high voltage to one or more word lines not being read, the word lines not being read are each connected to a set of memory cells, the high voltage exceeds a threshold voltage of memory cells in the set of memory cells,
after the applying the high voltage to the one or more word lines not being read, waiting for a time delay,
after the waiting for the time delay, sensing data from a collection of nonvolatile storage elements, the set of nonvolatile storage elements is connected to a word line being read, and applying ECC to the data sensed from the collection of nonvolatile storage elements.

17. The method of claim 16, wherein the first adjusted read operation further comprises:
if the applying ECC successfully converges to a solution, transferring the data sensed from the collection of nonvolatile storage elements to a second memory block, the second memory block is different from the first memory block.

18. The method of claim 16, wherein the second adjusted read operation further comprises:
if the applying ECC successfully converges to a solution, transferring the data sensed from the collection of nonvolatile storage elements to a second memory block, the second memory block is different from the first memory block.

19. The method of claim 16, further comprising:
retiring the first memory block from further use.

20. The method of claim 16, further comprising:
designating the first memory block for specialized use; and
performing the specialized use, the specialized use comprising:
in response to a request from a host of the first memory block to program the first memory block, performing a programming operation on one or more word lines in the first memory block other than the one or more broken word lines in the first memory block,
in response to a request from the host of the first memory block to erase the first memory block, performing an erase operation on the first memory block, and
in response to a request from the host of the first memory block to read from the first memory block, performing the second adjusted read operation on one or more word lines in the first memory block other than the one or more broken word lines in the first memory block.

* * * * *